US006329017B1

(12) United States Patent
Liu et al.

(10) Patent No.: US 6,329,017 B1
(45) Date of Patent: Dec. 11, 2001

(54) MESOPOROUS SILICA FILM FROM A SOLUTION CONTAINING A SURFACTANT AND METHODS OF MAKING SAME

(75) Inventors: Jun Liu, West Richland, WA (US); Karel Domansky, Cambridge, MA (US); Xiaohong Li, Richland, WA (US); Glen E. Fryxell; Suresh Baskaran, both of Kennewick, WA (US); Nathan J. Kohler, Richland, WA (US); Suntharampillai Thevuthasan, Kennewick, WA (US); Christopher A. Coyle; Jerome C. Birnbaum, both of Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/413,062

(22) Filed: Oct. 4, 1999

Related U.S. Application Data

(63) Continuation-in-part of application No. 09/361,499, filed on Jul. 23, 1999, now abandoned, which is a continuation-in-part of application No. 09/335,210, filed on Jun. 17, 1999, now abandoned, which is a continuation-in-part of application No. 09/220,882, filed on Dec. 23, 1998, now abandoned.

(51) Int. Cl.$^7$ ........................................................ B05D 3/12
(52) U.S. Cl. ...................... 427/240; 427/425; 427/397.7
(58) Field of Search ..................... 427/240, 425, 427/397.7; 118/52, 320

(56) References Cited

U.S. PATENT DOCUMENTS

| 4,913,966 | 4/1990 | Garvey . |
| 5,057,296 | 10/1991 | Beck . |
| 5,098,684 | 3/1992 | Kresge . |
| 5,102,643 | 4/1992 | Kresge . |
| 5,104,515 | 4/1992 | Chu . |
| 5,108,725 | 4/1992 | Beck . |
| 5,112,589 | 5/1992 | Johnson . |
| 5,145,816 | 9/1992 | Beck . |
| 5,156,829 | 10/1992 | McCullen . |
| 5,198,203 | 3/1993 | Kresge . |
| 5,211,934 | 5/1993 | Kresge . |
| 5,215,737 | 6/1993 | Chu . |
| 5,238,676 | 8/1993 | Roth . |
| 5,250,282 | 10/1993 | Kresge . |
| 5,256,277 | 10/1993 | DelRossi . |
| 5,264,203 | 11/1993 | Beck . |
| 5,300,277 | 4/1994 | Kresge . |
| 5,321,102 | 6/1994 | Loy . |
| 5,364,797 | 11/1994 | Olson . |
| 5,470,802 | 11/1995 | Gnade . |
| 5,472,913 | 12/1995 | Havemann . |
| 5,494,858 | 2/1996 | Gnade . |
| 5,504,042 | 4/1996 | Cho . |
| 5,523,615 | 6/1996 | Cho . |
| 5,561,318 | 10/1996 | Gnade . |
| 5,565,142 | 10/1996 | Deshopande . |
| 5,622,684 | 4/1997 | Pinnavaia . |
| 5,625,108 | 4/1997 | Perego . |
| 5,647,962 | 7/1997 | Jansen . |
| 5,661,344 | 8/1997 | Havemann . |
| 5,723,368 | 3/1998 | Cho . |
| 5,736,425 | 4/1998 | Smith . |
| 5,753,305 | 5/1998 | Smith . |
| 5,789,819 | 8/1998 | Gnade . |
| 5,795,559 | 8/1998 | Pinnavaia . |
| 5,795,566 | 8/1998 | Jansen . |
| 5,800,799 | 9/1998 | Pinnavaia . |
| 5,804,508 | 9/1998 | Gnade . |
| 5,807,607 | 9/1998 | Smith . |
| 5,840,271 | 11/1998 | Carrazza . |
| 5,847,443 | 12/1998 | Cho . |
| 5,858,457 | 1/1999 | Brinker et al. . |
| 5,922,299 | 7/1999 | Bruinsma . |

FOREIGN PATENT DOCUMENTS

WO 91/11390  8/1991  (WO) .
WO 96/39357  12/1996  (WO) .

OTHER PUBLICATIONS

Non–Ionic Surfactants, Kirk–Othmer Encyclopedia of Chemical Technology, 4th Edition, vol. 23, pp. 506–510 (no month), 1997.*
C.T. Kresge, M.E. Leonowocz, W.J. Orth, J.C. Vartuli & J.S. Beck, Ordered Mesoporous Moledular Sieves Synthesized bya Liquisd–Crystal Template Medhanism, Nature, vol. 359, Oct. 22, 1992.
Jeffery S. Beck and James C. Vartuli, Recent Advance in the synthesis, Characterization and Applications of Mesoporous Molecular Sieves, Curr, Opinion in Solid State and Material Science, 1996, 1:76–87 (No month avail.).
J.S. Beck, J.C. Vartuli, W.J. Roth, M.E. Leonowicz, C.T. Kresge, K.D> Schmitt, C.T–W Chu, D.H. Olson, E. W. Sheppard, S.B. McCullen, J.B. Higgins and J.L. Schlenker, A New Family of Mesoporous Sieves Prepared with Liquid Crystal Templates, J. Am. Chem. Soc., 1992, 1441:10835 (No month avail.).

(List continued on next page.)

Primary Examiner—Shrive P. Beck
Assistant Examiner—Jennifer Calcagni
(74) Attorney, Agent, or Firm—Marger Johnson & McCollom, P.C.

(57) ABSTRACT

The present invention is a mesoporous silica film having a low dielectric constant and method of making having the steps of combining a surfactant in a silica precursor solution, spin-coating a film from this solution mixture, forming a partially hydroxylated mesoporous film, and dehydroxylating the hydroxylated film to obtain the mesoporous film. It is advantageous that the small polyoxyethylene ether surfactants used in spin-coated films as described in the present invention will result in fine pores smaller on average than about 20 nm. The resulting mesoporous film has a dielectric constant less than 3, which is stable in moist air with a specific humidity. The present invention provides a method for superior control of film thickness and thickness uniformity over a coated wafer, and films with low dielectric constant.

62 Claims, 13 Drawing Sheets

OTHER PUBLICATIONS

Qisheng Huo, David Margolese, Ilike Ciesla, Dirl G. Demouth, Pingyun Feng, Thrumand E. Gier, Peter Sieger, Ali Firouzi, Brady F. Chmelka, Ferdi Schuth and Galen D. Stucky, Organization of Organic Molecules with Inorganic Molecular Species into Nanocomposite Biphase Arrays, Chem, Mater. 1994, 6:1176–1191 (No month avail.).

A. Firouzi, D. Kumar, L.M. Bull, T. Besier, P. Sieger, Q. Iluo, S.A. Walker, J.A. Zasadzinski, C. Glinka, J. Nicol, D. Margolese, G.D. Stucky, B.F. Chmelka, Cooperative Organization on Inorganic–Surfactant and Biomimetic Assemblies, Science, vol. 267, Feb. 24, 1995, pp. 1138–1143.

Peter T. Taney and Thomas J. Pinnavaia, A Neutral Templating Route to Mesoporous Molecular Sieves, Science, vol. 267, Feb. 10, 1995, pp. 865–867.

Stephen A. Bagshaw, Eric Prouzet and Thomas J. Pinnavaia, Templating of Mesoporous Molecular Sieves by Nonionic Polyetheylene Oxide Surfactants, Science, vol. 269, Sep. 1, 1995, pp. 1243–1244.

Peter T. Taney and Thomas J. Pinnavaia, Mesoporous Silica Molecular Sieves Prepared by Ionic and Neutral Surfactant Templating: A Comparison of Physical Properties, Chem. Mater. 1996, vol. 8, 2068–2079 (No month avail.).

David M. Antonelli and Jackie Y. Ying. Synthesis of A Stable Hexagonally Packed Mesoporous Niobium Oxide Molecular Sieve Through A Novel Ligand–Assisted Templating Mechanism, Angew, Chem. Int. Ed. Eng., 1996, vol. 35, No. 4, pp. 426–430 (No month avail.).

David M. Antonelli and Jackie Y. Ying, Synthesis and Characterization of Hexagonally Packed Mesoporous Tantalum Oxide Molecular Sieves, Chem. Mater. 199, vol. 8, pp. 874–881 (No date avail.).

Ilrike Siesla, Stefhan Schacht, Glen D. Stucky, Klaus K. Unger and Ferdi Schuth, Formation of a Porous Zirconium Oxide Phsphate with a High Surface Area bya Surfactant–Assisted Synthesis, Angew, Chem. Int. Ed. Engl. 1996, 35, No. 5, pp. 541–543 (No month avail.).

Sandra L. Burkett, Stephen D. Sims and Stephen Mann, Synthesis of Hybrid Inorganic Mesoporous Silica by Co–Condensations of Siloxane and Oranosiloxane Precursors, Chem. Commun., 1996, pp. 1367–1368 (No month avail.).

K.R. Klotstra, J.C. Jansena dn J. VanBekkum, Composite Molecular Sieve Comprising MCM–41 with Intraporous ZSM Structures, Symposium on Advances in FCC Conversion Catalysts Presented Before the Division of Petroleum Chemistry, Inc. 211th National Meeting, American Chemical Society, New Orleans, LA, Mar. 24–29, 1996.

Hong Yanh, Neil Cooms, Igor Sokolov and Geoffrey A. Ozin, Free–standing and Oriented Mesoporous Silica Films Grown at the Air–Water Interface, Nature, vol. 381, Jun. 13, 1996, pp. 589–592.

Chemical Abstracts, vol. 52:798e.

Organization of Organic Molecules with Inorganic Molecular Species in Nanocomposite Biphase Arrays, Huo, et al., American Chemical Society, 1994, 6, pp. 1176–1191.

* cited by examiner

MESOPOROUS SILICA FILM FROM A SOLUTION CONTAINING A SURFACTANT AND METHODS OF MAKING SAME

CROSS REFERENCE TO RELATED INVENTION

This application is a Continuation-In-Part of application Ser. No. 09/361,499, filed Jul. 23, 1999 now abandoned, which is a Continuation-in-Part of application Ser. No. 09/335,210, filed Jun. 17, 1999, now abandoned, which is a Continuation-In-Part of application serial number 09/220, 882 filed Dec. 23, 1998, now abandoned.

This invention was made with Government support under Contract DE-AC0676RLO1830 awarded by the U.S. Department of Energy. The Government has certain rights in the invention.

FIELD OF THE INVENTION

The present invention relates generally to porous silica film with nanometer-scale porosity produced from solution precursors. More specifically, the present invention relates to mesoporous silica film from a solution containing a surfactant (surfactant templated) and the use of specific surfactants to template porosity with the characteristic pore size being defined by the surfactant micelle size. The present invention also relates to the use of dehydroxylation in combination with surfactant templated mesoporous silica films to obtain a dielectric constant less than 3 under ambient humid conditions.

As used herein, the term "silica" means a compound having silicon (Si) and oxygen (O) and possibly additional elements.

Further, as used herein, "mesoporous" refers to a size range which is greater than 1 nm, but significantly less than a micrometer. In general, this refers most often to a size range from just over 1.0 nm (10 angstroms) to a few tens of nanometers.

The term "stable" can mean an absolute stability, a relative stability or a combination thereof. Relative stability means that a dielectric constant increases no more than about 20% when a surfactant templated mesoporous film is taken from an equilibrated condition of 0.0% relative humidity or vacuum to an equilibrated condition of 50% relative humidity. Absolute stability means that the dielectric constant remains less than 3 under any conditions including humid conditions of at least 40% relative humidity.

The term "hydroxylated" encompasses partially and fully hydroxylated. The term "dehydroxylating" encompasses partial or total removal of hydroxyl groups from surface(s) of the surfactant templated mesoporous silica film.

BACKGROUND OF THE INVENTION

Porous silica films are potentially useful as low dielectric constant intermetal materials in semiconductor devices, as low dielectric constant coatings on fibers and other structures, and in catalytic supports. Most of the U.S. semiconductor industry is presently (1998) in the process of implementing interlevel dielectric films that are silica films, or derivatives of silica and silicates, or polymeric films, with less than 25% or no porosity with dielectric constant (k') in the range of 3.0 to 4.0. Further reductions in dielectric constant are desired to improve the operating speed of semiconductor devices, reduce power consumption in semiconductor devices and reduce overall cost of semiconductor devices by decreasing the number of metallization levels that are required.

Since air has a dielectric constant of 1.0, the introduction of porosity is an effective way of lowering the dielectric constant of a film. In addition, because silica dielectrics have been a standard in microelectronic devices, silica films with porosity are very attractive to the semiconductor industry for advanced devices that require low dielectric constant materials. The feature size or design rule in the semiconductor interconnect will be sub-150 nm in ultralarge scale integration; and pore sizes to achieve lower dielectric constant (k<3) must be significantly smaller than the intermetal spacing.

Dielectric constant of porous films is dependent on the material and pore structure. For porous silica films for use in microelectronic devices, material and pore structure must result in uniform dielectric constants across the wafers and in different directions on the wafer. In general, isotropic material and pore structures are expected to provide the desired uniformity in film dielectric constant compared to anisotropic material and pore structures.

Also, low dielectric constant mesoporous films used commercially need to be prepared in a manner compatible with a semiconductor device manufacturing process line, for example spin coating. For large-area circular wafers, other coating techniques such as dip coating are not as convenient because dip coating requires masking of the backside to prevent contamination.

Surface topography is also very critical to fabrication of a multilevel interconnect structure. In the "damascene" process for copper interconnects intended for ultralarge scale integration on semiconductor chips, each dielectric layer is etched, following which copper is deposited, and the structure planarized by chemical-mechanical polishing (CMP). The initial planarity and the absence of surface texture in the low k dielectric film is very critical in maintaining planarity at each level of the interconnect.

Another important concern with porous dielectric films is mechanical integrity. Because of their fragility, it appears unlikely that porous films will be directly polished using conventional chemical-mechanical-polishing (CMP) equipment, but a dense "cap" layer of silica or another material on the porous low K film will be planarized. However, even with a cap layer, the porous low K material must have adequate stiffness, compressive and shear strengths, to withstand the stresses associated with the CMP process.

Silica films with nanometer-scale (or mesoporous) porosity may be produced from solution precursors and classified into two types (1) "aerogel or xerogel" films (aerogel/xerogel) in which a random or disordered porosity is introduced by controlled removal of an alcohol-type solvent, and (2) "mesoporous" surfactant-templated silica films in which the pores are formed with ordered porosity by removal of a surfactant. Heretofore, the most successful demonstration of low dielectric constant silica films with dielectric constant of 3.0 or less has been with aerogel/ xerogel-type porous silica films. However, disadvantages of aerogel/xerogel films include (1) deposition of aerogel/ xerogel films requires careful control of alcohol removal (e.g. maintaining a controlled atmosphere containing solvent or gelling agent during preparation) for formation of the pore structure (2) the smallest pore size typically possible in aerogel/xerogel films falls in the size range of 10–100 nm, and (3) limited mechanical strength compared to dense selica films. These disadvantages have hindered implementation of these aerogel/xerogel porous silica films in semiconductor devices.

In order to obtain a porous film with a low dielectric constant of any material made by any process, it is necessary to minimize the number of hydroxyl groups in the structure, especially at pore surfaces. The dielectric films must be made hydrophobic in order for the electrical properties to be stable in humid air. Hydroxylated surfaces in porous silica films result in a dielectric constant exceeding that of dense silica (i.e. approximately 4.0). Physisorption of water molecules by hydroxylated surfaces can further increase the dielectric constant and effective capacitance of a mesoporous silica film. Physisorption of water molecules can be avoided by handling films in non-humid atmospheres or vacuum, or by minimizing exposure of films to humid conditions. Hydroxyl groups and physisorbed water molecules may be removed from silica surfaces at very high temperatures. C. J. Brinker and G. W. Scherer, in *Sol-Gel Science*, Academic Press, New York, N.Y. (1990) (Brinker et al. 1990) discuss thermal dehydroxylation of silica by exposure to very high temperatures of over 800° C. However, semiconductor devices with dielectric films and metal lines cannot usually be processed over about 500° C. Thus, other methods of dehydroxylation are needed for porous silica films on semiconductors.

E. F. Vansant, P. Van der Voort and K. C. Vrancken, in *Characterization and Chemical Modification of the Silica Surface*, Vol. 93 of Studies in Surface Science and Catalysis, Elsevier, New York, N.Y. (1995), and Brinker et al., 1990, cite procedures for hydroxylation of silica surfaces by fluorination or by treatment with silane solutions. Aerogel/Xerogel-type films have been dehydroxylated by both (a) fluorination treatment, and (b) a two-step dehydroxylation method of (1) initial silane solution treatment (e.g. trimethylchlorosilane or hexamethyidisilazane (HMDS) in a solvent), and then (2) following this solution treatment with a treatment in hydrogen-containing gases (e.g. 10% hydrogen in nitrogen) at moderately high temperatures of 300–450° C. The silane/forming gas($H_2$ in $N_2$) treatment is discussed in U.S. Pat. No. 5,504,042 and some of the other related patents by Smith and colleagues that are referenced therein.

In the surfactant-templated films, the pores form ordered (e.g. hexagonal) arrays, with the characteristic pore size being defined by the surfactant micelle size. The surfactant templated route allows control of the porosity, pore size and pore shape using the properties of the surfactants and their interactions with the silica species. For a given level of porosity, this control in pore size and architecture and structure of the pore walls can also result in good mechanical properties. More specifically, smaller and uniform pores can impart better mechanical properties than larger and non-uniform pores. Although easier to produce (no need for controlled atmosphere to form the porosity), mesoporous surfactant templated silica films have not been demonstrated with low dielectric constant.

U.S. Pat. application 08/921,754 filed Aug. 26, 1997 by Bruinsma et al, now U.S. Pat. No. 5,922,299, describes the preparation of mesoporous surfactant templated silica films with ordered porosity of spin coating. The surfactant used was a cationic ammonium-based surfactant. A goal of this work was low-dielectric constant interlayers in microelectronic devices.

U.S. Pat. No. 5,858,457 by Brinker et al also reports a dip coating procedure for making a surfactant-templated mesoporous silica film with ordered porosity, where the surfactant used was also a ammonium-based surfactant. Brinker et al measured the dielectric constant using a mercury dot electrode on the film, reporting a value for the dielectric constant of 2.37.

However, surfactant templated mesoporous silica films prepared with ammonium surfactants and tested after pyrolysis (thermal removal) of the surfactant have been found to adsorb moisture under ambient humid conditions, and therefore do not have a low dielectric constant under the ambient humid conditions of normal manufacturing and operating conditions for semiconductor devices. No dehydroxylation steps are reported in either Bruinsma et al. or Brinker et. al.

The paper Continuous Mesoporous Silica Films With Highly Ordered Large Pore Structures, D. Zhao, P. Yang, N. Melosh, J. Feng, BF Chmelka, and GD Stucky, Advanced Materials, vol. 10 No. 16, 1998, pp 1380–1385, discusses the formation of directional or ordered large pore structures in films by dip coating silica based solutions containing non-ionic poly(alkalene oxide) triblock copolymers and low molecular weight alkyl(ethylene oxide) surfactants. Low dielectric constants (1.45–2.1) were reported for these films as measured after calcination of the films. However, a disadvantage of ordered porosity, for example hexagonal porosity, is the uncertainty in uniformity of dielectric constant in different directions on large wafers. Furthermore, no dehydroxylation procedures, that are useful for maintaining low values of dielectric constant, are reported in the paper by Zhao et al.

Thus, there is a need for a surfactant templated mesoporous silica films and method of making them that provides a dielectric constant less than 3, and that meets engineering requirements including but not limited to control of film thickness and thickness uniformity, minimum surface texture, and mechanical integrity. The dielectric constant must be relatively stable under normal operating conditions which include humid air at room temperature, and must be uniform across large wafers.

SUMMARY OF THE INVENTION

It is therefore an object of the present invention to provide a surfactant templated mesoporous silica film which has properties including but not limited to dielectric constant less than 3, film thickness from about 0.1 $\mu$m to about 1.5 $\mu$m, standard deviation of film thickness less than or equal to +/−5% standard deviation, average pore sizes smaller than about 20 nm, low dielectric constant and combinations thereof.

The present invention includes a method of making a surfactant templated mesoporous film having the same general steps as described in U.S. Pat. No. 5,922,199. Thus, the present invention is a method of making a mesoporous silica film having the steps of combining a surfactant in a silica precursor solution, spin-coating a film, heating the film to remove the surfactant to form a mesoporous film that is at least partially hydroxylated, and dehydroxylating the partially hydroxylated film to obtain the mesoporous film. According to the present invention, selection of surfactant, selection of concentrations of silica precursor solution constituents and combinations thereof provide a film having one or more of the features set forth above.

The advantage of low dielectric constant (k<3) that is stable at ambient humid conditions is achieved in accordance with the present invention in combination with dehydroxylation which involves partial or complete removal of hydroxyl groups at temperatures within electronic component processing temperatures. During dehydroxylation, hydroxyl groups may be replaced with hydrophobic groups such as organic alkyl groups, siloxane (—Si—O—Si—) bonds or combinations thereof on internal pore surfaces as well as external surfaces of the surfactant templated mesoporous film.

It is advantageous that the surfactants used in spin-coated surfactant templated mesoporous films as described in the present invention will result in fine pores smaller than about 20 nm. Most often the average pore size can be tailored with surfactants in the size range of about 1 to about 20 nm. This pore size range is desirable in interlevel dielectric films that separate metallization lines in semiconductor devices to minimize diffusion of metal species during repeated heat treatments. Further advantages of the present invention include a method which provides for superior control of film thickness and thickness uniformity across a coated wafer, films with low dielectric constant that is stable; as well as disordered porosity which increases confidence in uniformity of dielectric constant in different directions on large wafers.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DESCRIPTION OF THE PREFERRED EMBODIMENT(S)

Figure 1:
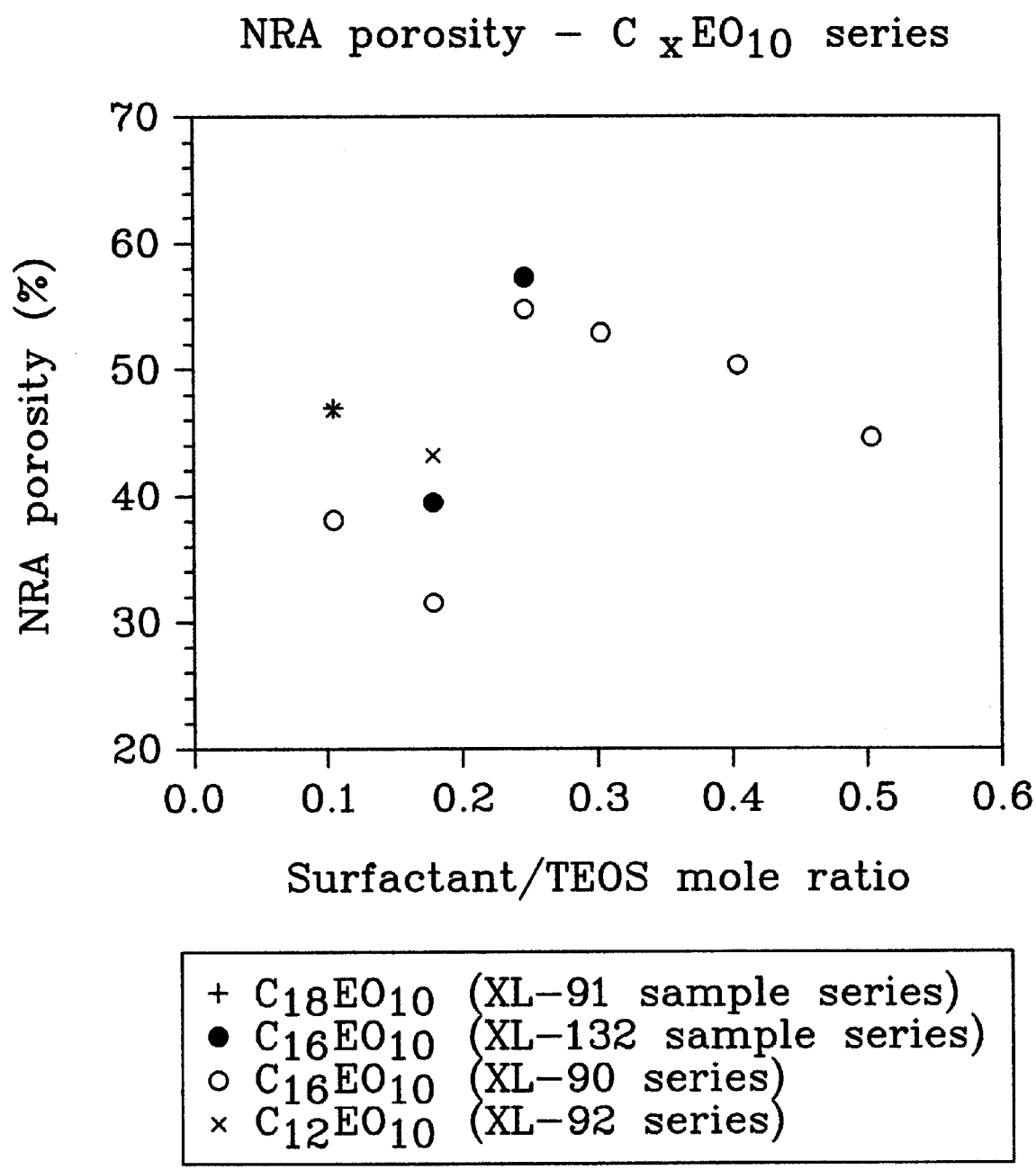
FIG. 1 shows film porosity as a function of surfactant/TEOS mole ratio in a spin-coating solution containing polyoxyethylene ether surfactants as determined by nuclear reaction analysis (NRA) for the $C_xEO_{10}$ polyoxyethylene ether surfactant series.

The present invention is a mesoporous silica film made from a surfactant containing solution (surfactant templated mesoporous silica film) which has properties including but not limited to a dielectric constant less than 3, film thickness from about 0.1 μm to about 1.5 μm, also from about 0.2 μm to about 1.5 μm standard deviation of film thickness less than or equal to +/−5% standard deviation, average pore sizes smaller than about 20 nm, more preferably less than about 10 nm and most preferably less than about 5 nm, ordered or disordered porosity, and combinations thereof. According to the present invention, porosity is greater than 30%, preferably greater than 40% and more preferably greater than 50%.

The present invention includes a method of making a mesoporous silica film by templating and spin-coating silica precursor solutions containing a surfactant to form a hydroxylated film which are the same general steps as described in U.S. Pat. No. 5/922,299, and that application is thus incorporated herein by reference, and then chemically dehydroxylating the hydroxylated film to form the mesoporous silica film. Therefore, the present invention is a method of making a mesoporous silica film having the steps of combining a surfactant in a silica precursor solution, forming a film by spin-coating, heat treating the film to remove the surfactant and forming a mesoporous film that is hydroxylated, and chemically dehydroxylating the hydroxylated film to obtain the mesoporous silica film with a low dielectric constant.

The silica precursor solution includes a silica precursor, an aqueous solvent, a catalyst and a surfactant. A film is made by spin-coating a mixture of the silica precursor solution and surfactant, after which the aqueous solvent, the catalyst, and the surfactant are removed by heating to form mesoporous silica film that is hydroxylated. Chemically dehydroxylating the hydroxylated film results in a mesoporous silica film with a low dielectric constant. The chemical dehydroxylating is preferably achieved by exposing the hydroxylated film separately to a silicon-based organic compound such as a silane, either as the pure liquid or pure vapor or as a solution, or as a vapor in a carrier gas or gas mixture, and a dehydroxylating gas. The resulting mesoporous film has a dielectric constant less than 3 that remains less than 3 in a humid environment.

According to a further preferred embodiment of the present invention, low dielectric constant (k<3) mesoporous surfactant-templated films may be obtained by using one or more dehydroxylation step(s) that includes removing hydroxyl groups from surfaces of the mesoporous material. In this embodiment, the surfactant may be any surfactant including but not limited to non-ionic surfactant, cationic surfactant, anionic surfactant, amphoteric surfactant, and combinations thereof.

The precursor solution may include a chemical agent including but not limited to a second surfactant, a smaller hydrophilic molecular compound, an organic co-solvent and combinations thereof. A second surfactant includes but is not limited to non-ionic surfactant, cationic surfactant, anionic surfactant, amphoteric surfactant and combinations thereof. Smaller hydrophilic molecular compound includes but is not limited to glycerol, propylene glycol, ethylene glycol and combinations thereof. Organic co-solvent includes but is not limited to mesitylene, octane and combinations thereof.

The silica precursor includes but is not limited to tetraethyl orthosilicate (TEOS), tetramethyl orthosilicate (TMOS) methyl triethoxysilane, phenyl triethoxy silane, dimethyl dimethoxy silane, ethyl triethoxysilane and combinations thereof.

In a preferred embodiment, the aqueous solvent includes ethanol.

The catalyst includes but is not limited to inorganic acid including but not limited to hydrochloric acid, nitric acid, sulfuric acid; organic acid including but not limited to carboxylic acid, amino acid and combinations thereof. Carboxylic acid includes but is not limited to methanoic acid (formic acid), ethanoic acid (acetic acid), ethandioic acid (oxalic acid), butanoic acid (butyric acid), and combinations thereof. Amino acid includes but is not limited to glycine, nitromethane and combinations thereof.

A preferred non-ionic surfactant is a polyoxyethylene ether surfactant. The term "non-ionic" refers to a surfactant chemistry where cationic (e.g. ammonium or sodium ions) or anionic (e.g. sulfonate, sulfate or halide) species are not present. The non-ionic polyoxyethylene ether surfactants described in this application are small molecules containing carbon, hydrogen and oxygen, with only a hydroxyl (—OH) group at the hydrophilic end of the polymer. With the use of these surfactants, in combination with the dehydroxylation procedure, low dielectric constants (i.e. low capacitance in films) are obtained using simple synthesis and processing conditions. Additionally, greater film thickness uniformity, minimum surface texture, and stability of dielectric constant are obtained through the use of these surfactants.

Surfactants in this polyoxyethylene ether family include but are not limited to $C_{12}H_{25}$ $(CH_2CH_2O)_{10}OH$ also known as $C_{12}EO_{10}$ or 10 lauryl ether;

$C_{16}H_{33}(CH_2CH_2O)_{10}OH$ also known as $C_{16}EO_{10}$ or 10 cetyl ether; $C_{18}H_{37}$ $(CH_2CH_2O)_{10}OH$ also known as $C_{18}EO_{10}$ or 10 stearyl ether;

$C_{12}H_{25}(CH_2CH_2O)_4OH$ also known as $C_{12}EO_4$ or 4 lauryl ether;

$C_{16}H_{33}(CH_2CH_2O)_2OH$ also known as $C_{16}EO_2$ or 2 cetyl ether, and combinations thereof.

Additionally, polyoxyethylene ether surfactant may be used in conjunction with a chemical agent including but not limited to other surfactants, smaller hydrophilic molecular compounds compatible with the ethanol and water present in the aqueous solvent, organic co-solvents compatible with the surfactant(s) and combinations thereof. The surfactants include but are not limited to ammonium-based cationic surfactants such as cetyl trimethyl ammonium chloride. The organic co-solvents include but are not limited to mesitylene, octane and combinations thereof. The smaller hydrophilic molecular compounds include but are not limited to glycerol, propylene glycol, ethylene glycol, and combinations thereof. The smaller hydrophilic molecular compounds have much higher boiling points compared to water and ethanol as well as low vapor pressures. These smaller hydrophilic molecular compounds are likely to reside as inclusions in the silica-rich walls that have formed around the surfactant micelles upon spin-coating and drying, and upon calcination, these inclusions can leave behind finer scale porosity in the silica walls.

The silica precursor solution is made up of four solution compounds of (1) a silica precursor, preferably tetraethyl orthosilicate (TEOS); (2) an aqueous solvent, for example, ethanol, water and combinations thereof; (3) a catalyst for hydrolysis of the silica precursor, preferably an acid, for example nitric acid or hydrochloric acid, and (4) a surfactant. Because TEOS is not soluble in water alone, a co-solvent, preferably ethanol, is added. Although a preferable solution mixture contains mole ratios of: TEOS 1.0; water 5; ethanol 5; HCl 0.05; and surfactant 0.17, the surfactant/TEOS mole ratio can be varied to control the pore-volume fraction in the final film and to vary the pore structure. Also, it will be recognized by those skilled in the art that a much wider range of surfactant sizes and amounts in this family of small polyoxyethylene ethers may be possible with different solvent amounts. It is important to avoid precipitation of the silica precursor in the solution prior to spin coating. Precipitation of the silica precursor may be avoided by the use of alcohol as a co-solvent, preferably as a primary solvent, in combination with acidic pH. Alternatively, precipitation may be avoided by controlling the water to TEOS mole ratio alone or in combination with control of pH, addition of alcohol, or both.

A templated film is made by spin-coating the silica precursor solution. The solution is dispensed onto the surface of a substrate and spun using a spin-coater, for example at 2000 rpm for 30 seconds. The substrate is preferably a silicon wafer or an aluminum-coated silicon wafer, but it is not limited to these substrates.

The spin-coating technique used in the present invention requires no atmosphere control when used with these surfactant-containing solutions, and the method should be readily applicable to microelectronics manufacturing. The technique produces films with good thickness uniformity across wafers ranging from small to large surface area. Films produced by the method of the present invention have film thickness from about 0.2 $\mu$m to about 1.5$\mu$m with a thickness variation having a standard deviation of less than +/−5%. For example, one film with a thickness of about 0.8 $\mu$m had a thickness variation with a standard deviation of less than 25 nanometers (0.3%) across a 4-inch wafer. The film thickness can be controlled by adjusting the relative ratios of the solution compounds, and also by varying the spinning rate during deposition.

After spin-coating, the surfactant-templated film is formed into a hydroxylated mesoporous film by removal of the aqueous solvent, the acid, and the surfactant. Aqueous solvent removal is typically achieved by heating the spin-coated film. For example, exposing the spin-coated film to a temperature of 115° C. for 1 hour completes drying and increases condensation of the silica. Further heat treatment (calcination) of the film, for example at a temperature of 475° C. for 5 hours, or at 400° C. on a hot plate for 5 minutes in N2 gas, removes the surfactant and forms a mesoporous film that is partially hydroxylated.

The partially hydroxylated film is chemically dehydroxylated into a mesoporous silica film by exposing the partially hydroxylated film to a silicon-based organic compound such as a silane, either as the pure liquid or pure vapor or as a solution, or as a vapor in a carrier gas or gas mixture. The silane can be chosen from the following and not limited to trimethyl iodosilane, trimethyl chlorosilane, dimethyl dimethoxy silane, hexamethyl disilazan dimethyl dichlorosilane hexaphenyl disilazane, and diphenyl tetramethyl silazane. Additionally, the silane exposed film may be further exposed to, a dehydroxylating gas or to a heat treatment. The silane treatment may be preceded and followed by a vacuum treatment or a treatment in an inert gas or forming gas, or both. The partially hydroxylated film is preferably dehydroxylated in a two-step process which includes a soak treatment in a solution of hexamethyl disilazane in an organic solvent and exposure to an $H_2$ in $N_2$ gas at an elevated temperature. The partially hydroxylated film is more preferably dehydroxylated in a multiple step high temperature process, which includes an initial vacuum treatment, followed by a vapor phase silane treatment, followed by a second vacuum treatment. The silane/vacuum treatment step is preferably repeated using the same silane or a different silane and is followed by a high temperature inert gas or forming gas treatment.

For example, soaking the hydroxylated film for 24 hours in a 10% solution of hexamethyl disilazane in toluene and then exposing it to 2% $H_2$ in $N_2$ gas at 400° C. for 2 hours results in effective dehydroxylation of the mesoporous film, which then exhibits stable dielectric properties in moist air. This sequence of dehydroxylation process steps is preferably repeated once. The resulting mesoporous film has a dielectric constant typically less than 2.5 under ambient humid conditions, and the dielectric constant of the film is stable in moist or humid atmosphere over long periods of time.

EXAMPLE 1

An experiment was conducted to demonstrate the efficacy of a preferred embodiment of the present invention. Three different surfactants in the polyoxyethylene ether family were investigated: (1) $C_{12}H_{25}$ $(CH_2CH_2O)_{10}OH$, also known as $C_{12}EO_{10}$ or 10 lauryl ether; (2) $C_{16}H_{33}$ $(CH_2CH_2O)_{10}OH$, also known as $C_{16}EO_{10}$ or 10 cetyl ether; and (3) $C_{18}H_{37}$ $(CH_2CH_2O)_{10}OH$, also known as $C_{18}EO_{10}$ or 10 stearyl ether. All the films with these surfactants were prepared using a solution with the following molar ratios: TEOS:H20:ethanol:hydrochloric acid=1:5:5:0.05.

The surfactant/TEOS mole ratio was varied from about 0.10 to about 0.50. All the components except for the TEOS were mixed until a homogeneous solution was obtained. When the surfactant/TEOS mole ratio is greater than about 0.2 and ratios of TEOS:H20: ethanol are about 1:5:5, homogenaity is more readily achieved by heating the solution from about 40° C. to about 50° C., especially for polyoxyethylene ether surfactants. Heating may not be needed for more dilute solutions.

TEOS was then added and the solution was stirred. Following addition of TEOS, the solution was aged for 20 hours at room temperature. No precipitate was formed under these solution conditions.

The aged solution was dispensed onto the surface of polished 4-inch Si wafers by spin-coating at 2000 rpm for 30 seconds using a spin-coater.

The resulting surfactant-templated films were converted to a mesoporous film by removing the aqueous solvent, the acid, and the surfactant. This removal was achieved by subjecting the templated films to a temperature of 115° C. for 1 hour. Complete removal of the surfactant from the films was achieved by calcination (heat treatment) at 475° C. for 5 hours.

Prior to making electrical/capacitance measurements, the calcined films were characterized by nuclear reaction analysis (NRA) to determine porosity, and by profilometry to measure thickness. The NRA porosity data was not used as an exact measure of porosity, but rather was used for guidance to help determine which films to select for further electrical/capacitance measurements.

FIG. 1 shows the porosity determined by NRA for the $C_xEO_{10}$ polyoxyethylene ether surfactant series. The graph shows only porosity values using the different surfactants for only specific surfactant/TEOS values. For several higher surfactant/TEOS ratios the film quality was not acceptable for evaluation of electrical properties, and films formed with such ratios were therefore not investigated further. For consideration as dielectric films in semiconductor devices, the film thickness should be in the range of about 0.5 to about 1.2 $\mu$m. In addition, the films should be uniform in thickness, crack-free, and without major blemishes or surface defects. Films with non-wetted islands, cracks, ring-like structures, serrated patterns or cloudy inclusions were not considered for electrical evaluation. Defects such as comets (e.g. due to dust particles on the wafer) on otherwise uniform films were considered acceptable, as these could not be attributed to inherent solution properties. The table E1-1 lists the observations in terms of film quality with these surfactants at different concentrations.

TABLE E1-11

Film Quality for $C_xEO_{10}$ based Films

| Surfactant>>>> Surfactant/TEOS mole ratio (below) | Film Quality $C_{12}EO_{10}$ | Film Quality $C_{16}EO_{10}$ | Film Quality $C_{18}EO_{10}$ |
|---|---|---|---|
| 0.10 | Good | Acceptable | Acceptable |
| 0.17 | Good | Poor | Poor |
| 0.24 | Poor | Acceptable | Poor |
| 0.30 | Poor | Acceptable | Poor |
| 0.40 | Poor | Poor | Poor |
| 0.50 | Poor | Poor | Poor |

Based on the NRA porosity data shown in FIG. 1 and the observations concerning film quality, two films were selected for electrical measurements. These two films as shown in Table 1 were those prepared with solutions containing (1) $C_{12}EO_{10}$, surfactant/TEOS mole ratio of 0.17; and (2) $C_{16}EO_{10}$, surfactant/TEOS mole ratio of 0.30.

Initial electrical testing of these calcined films for capacitance using a precision LCR meter yielded dielectric constants (i.e. capacitance) much higher than expected for porous films, because the film still contained a significant amount of hydroxyl (—OH) groups.

Each of these two partially hydroxylated films was therefore dehydroxylated by exposing the hydroxylated film separately to a silane and a dehydroxylating gas. The films were dehydroxylated by treatments of soaking for 24 hours in a 10% solution of hexamethyl disilazane in toluene and exposure for 2 hours to 2% $H_2$ in $N_2$ gas at 400° C. This sequence of dehydroxylation process steps was repeated once on each film, and the dielectric constant was measured after each of these steps.

The capacitance measurements were performed as follows. The backside of the wafer was scratched/etched to expose bare silicon surface and a layer of gold was then sputter-deposited. On the top film side, an array of gold dots approximately 2.8 mm in diameter was formed by sputtering using a shadow mask. Capacitance was measured at room temperature at ambient conditions for four dots on each sample, and the dielectric constant was calculated using the film thickness and dot diameter. The dielectric constant data obtained in this way is shown in FIG. 2 and FIG. 3 for the two different films.

Figure 2:
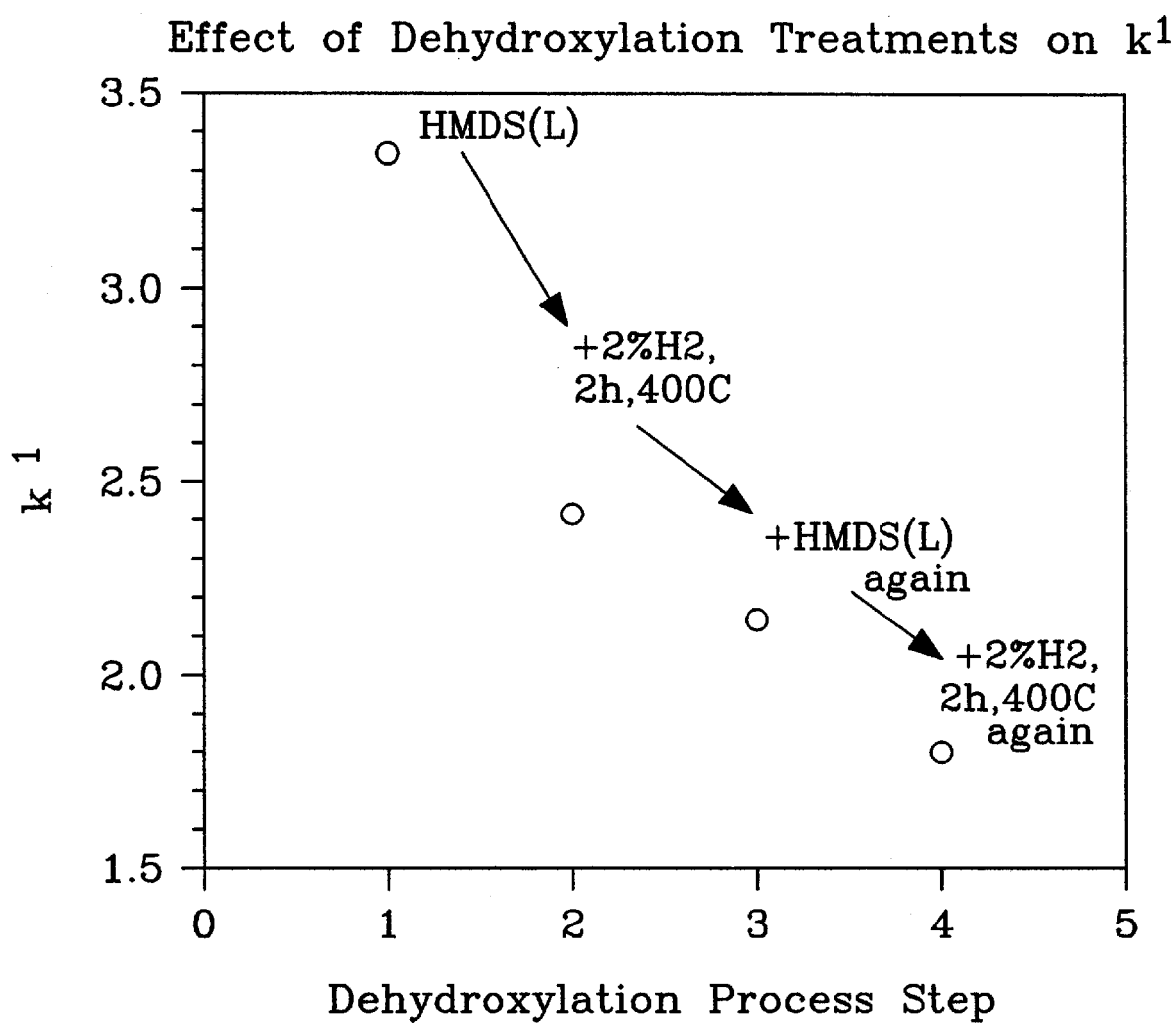
FIG. 2 shows the dielectric constant (measured at room temperature under ambient conditions in humid air) of a surfactant templated mesoporous film prepared with $C_{12}EO_{10}$ polyoxyethylene ether surfactant as a function of dehydroxylation procedures.
Figure 3:
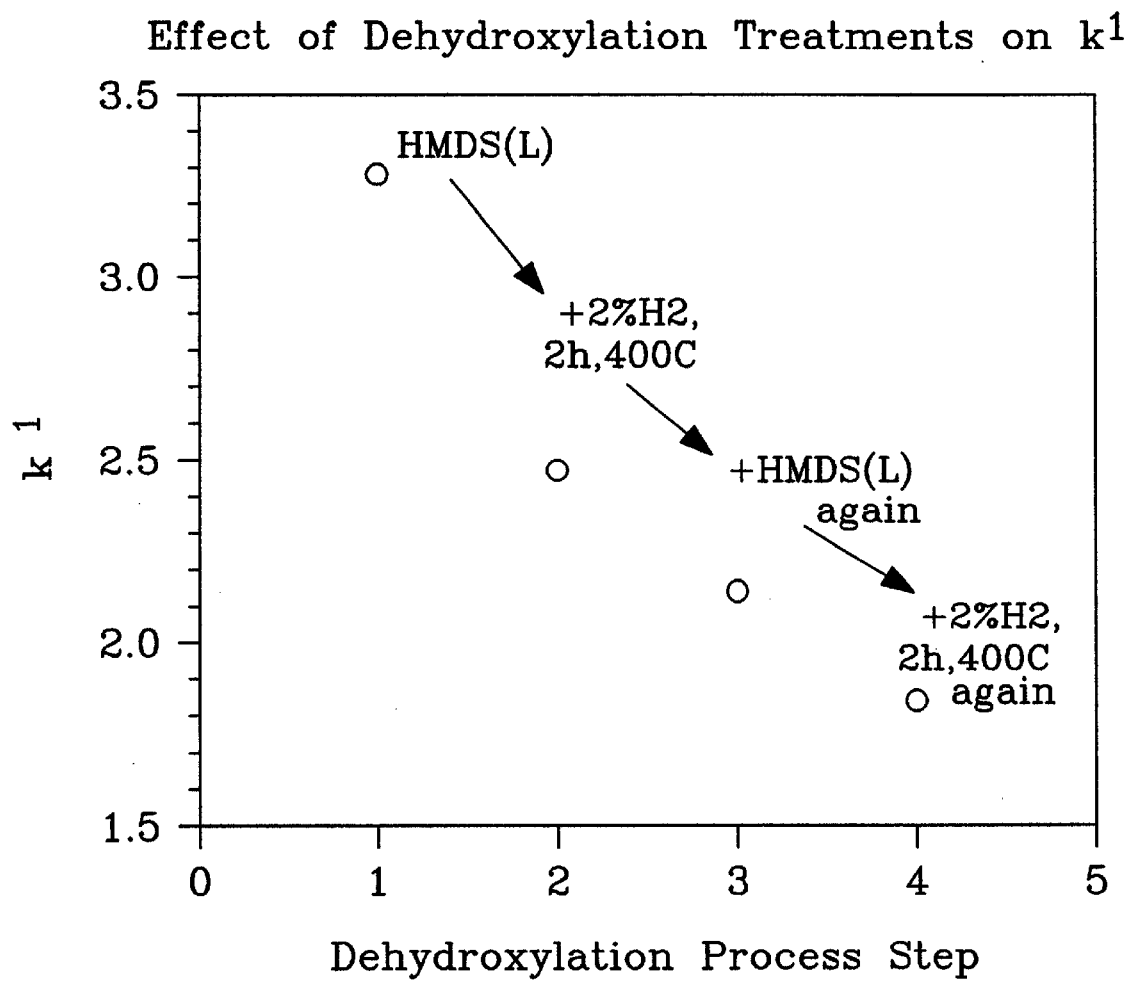
FIG. 3 shows the dielectric constant (measured at room temperature under ambient conditions in humid air) of a surfactant templated mesoporous film prepared with $C_{16}EO_{10}$ polyoxyethylene ether surfactant as a function of dehydroxylation procedures.

The data in FIG. 2 shows that a dielectric constant of 1.80 can be obtained for the film synthesized with the $C_{12}EO_{10}$ surfactant. The data in FIG. 3 shows that a dielectric constant of 1.85 can be obtained for the film synthesized with the $C_{16}EO_{10}$ surfactant. Such low dielectric constants indicate tremendous promise for application of such mesoporous silica films prepared with small polyoxyethylene ether surfactants in semiconductor devices. The low dielectric constants obtained with these films are also relatively stable, increasing by less than 5% over a period of one day in ambient laboratory conditions with temperatures at 20–22° C. and a relative humidity of 40–65%. The dielectric constants did not increase in value thereafter.

Figure 4A:
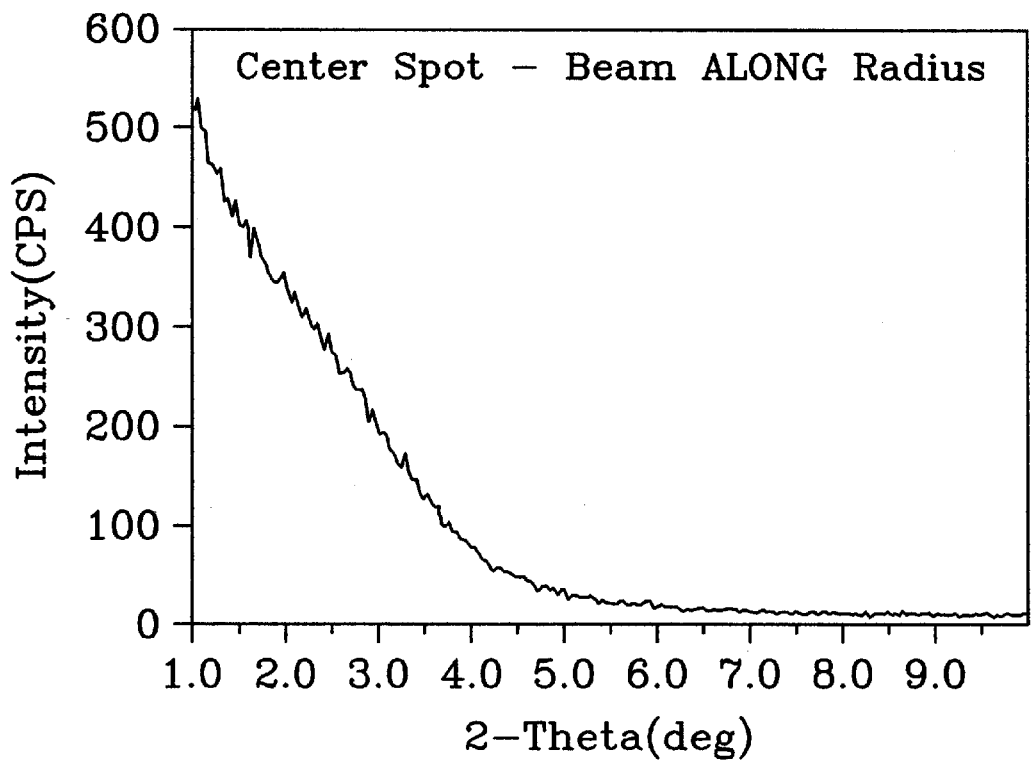
FIG. 4a shows the low angle x-ray diffraction spectrum for mesoporous silica film prepared with a $C_{12}EO_{10}$ polyoxyethylene ether surfactant. The x-ray beam was along the radial direction of the circular wafer.
Figure 4B:
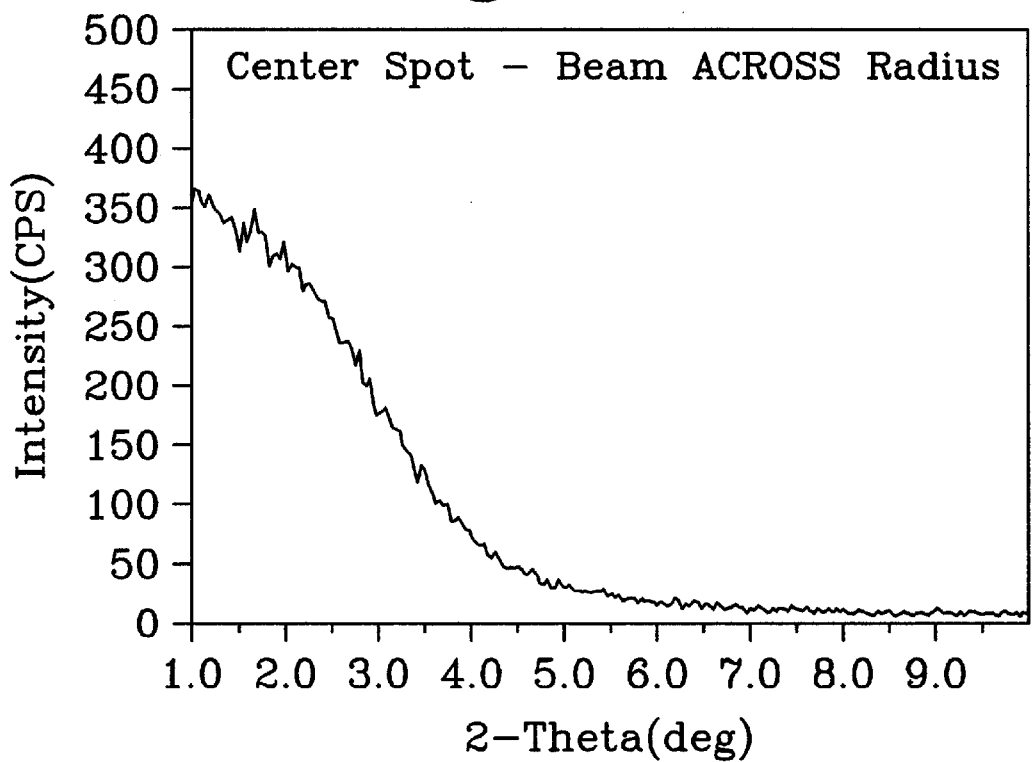
FIG. 4b shows the low angle x-ray diffraction spectrum for mesoporous silica film prepared with a $C_{12}EO_{10}$ polyoxyethylene ether surfactant. The x-ray beam was along the tangential direction of the circular wafer.
Figure 5:
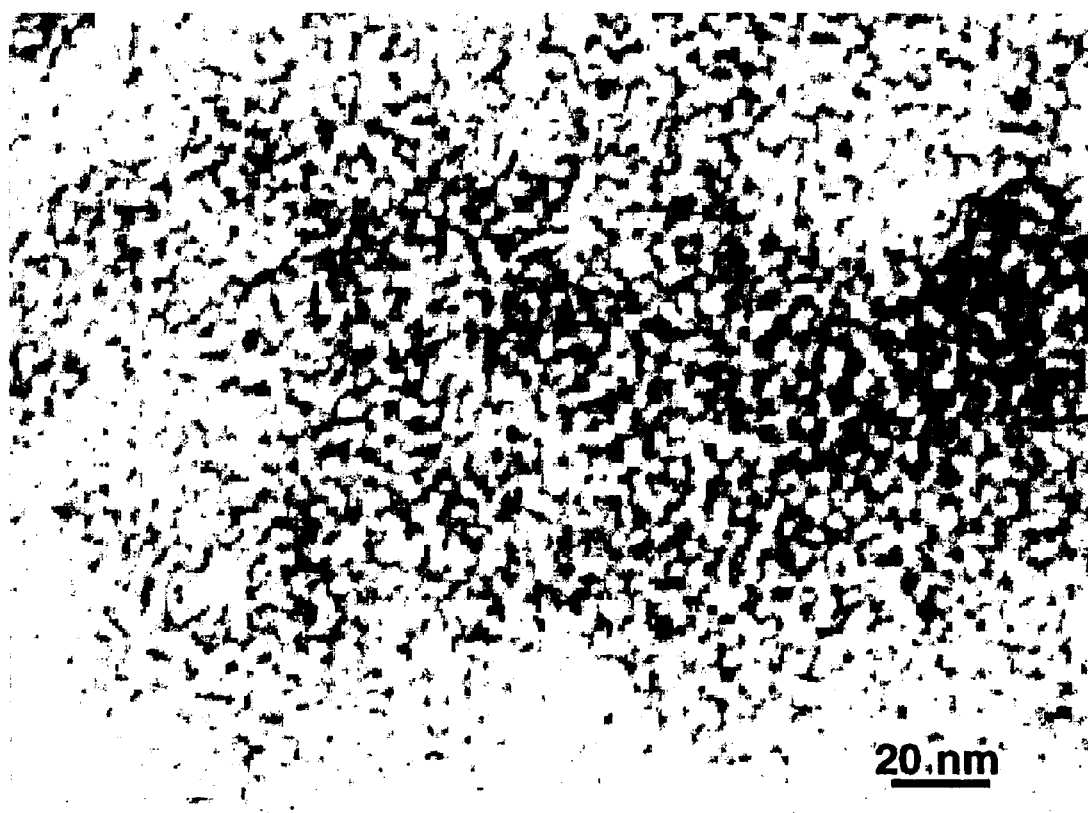
FIG. 5 is a transmission electron micrograph showing microstructure of the mesoporous silica film prepared with a $C_{12}EO_{10}$ polyoxyethylene ether surfactant.

The pore structure of the surfactant templated mesoporous film was probed by low angle x-ray diffraction (XRD) and transmission electron microscopy (TEM). The XRD spectra of the film on the wafer for two different directions, radial and tangential, are shown in FIGS. 4A, 4B. The spectra did not contain any peak in the range of 2 to 6 degrees 2-theta, thereby indicating that pores are not ordered. A TEM micrograph of a section of the film in FIG. 5 indicates that the pores are disordered with an isotropic nanoporous structure. Pore sizes were estimated to be less than 3 nm from TEM micrographs, and from nitrogen adsorption/desorption analysis of powders prepared from the solution by a rapid spray drying process.

Figure 6A:
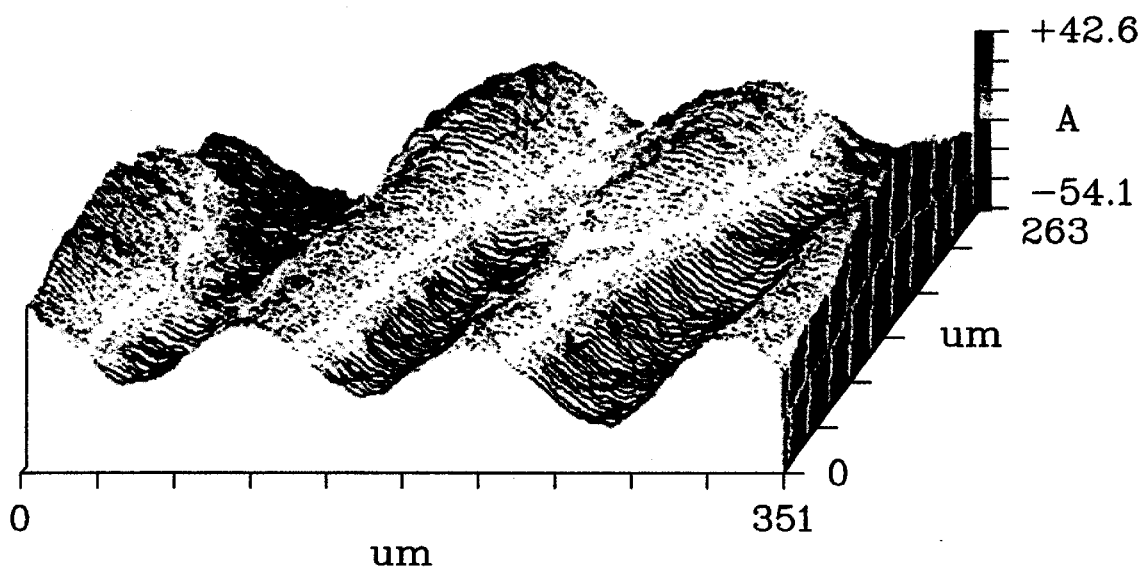
FIG. 6a is a surface contour map of a mesoporous silica film prepared with a $C_{12}EO_{10}$ polyoxyethylene ether surfactant.
Figure 6B:
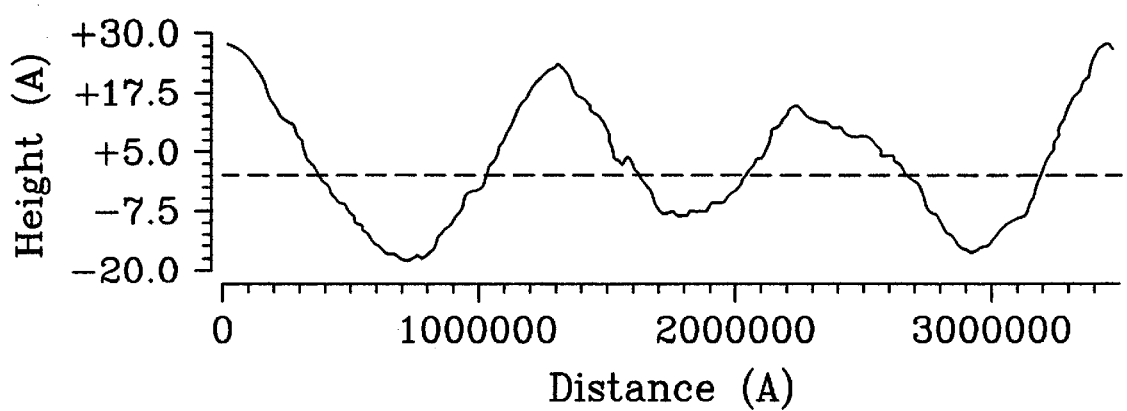
FIG. 6b is a surface profile of a mesoporous silica film prepared with a $C_{12}EO_{10}$ polyoxyethylene ether surfactant.

Film planarity and surface topography were measured by optical profilometry. Minimal striation-type surface texture was observed in these films. A surface contour map of the film is shown in FIG. 6a. Roughness is generally less than ±50 angstroms over length scales of tens of microns (FIG. 6b).

Figure 7:
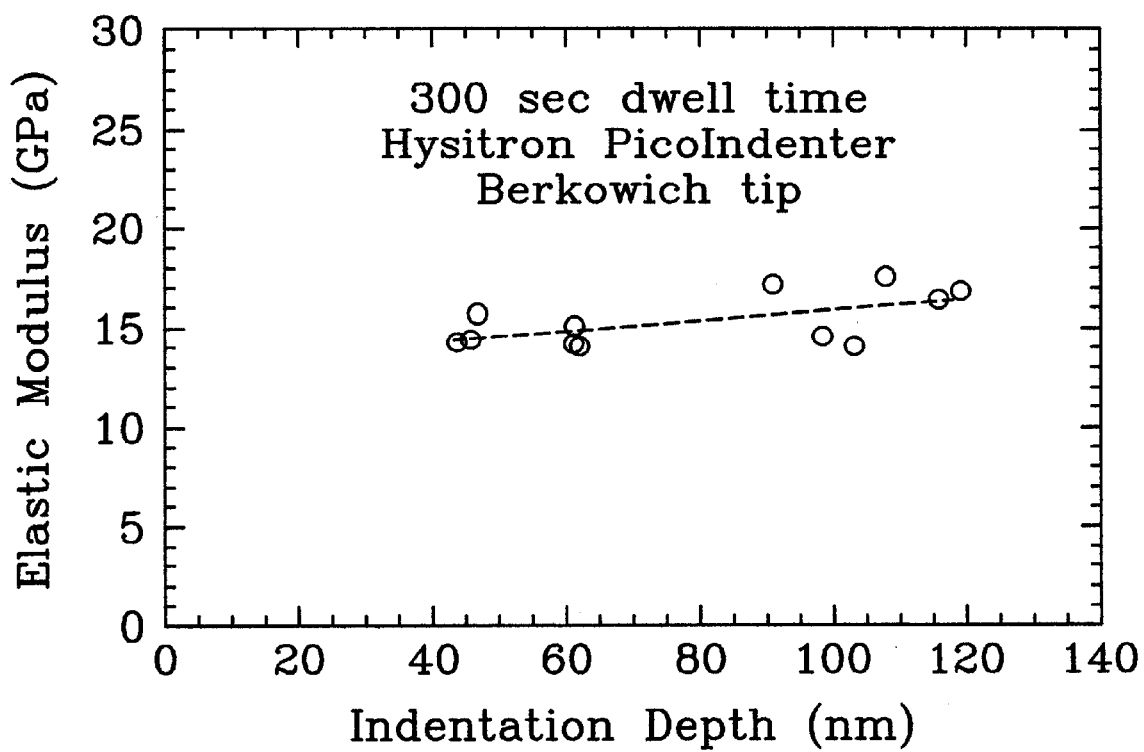
FIG. 7 is a graph of elastic modulus of a mesoporous silica film measured by picoindentation, as a function of the indentation load.

The elastic modulus of the mesoporous silica film was measured with a Hysitron Picoindenter™ using a Berkowich diamond tip. The instrument and tip were calibrated on a dense silica standard with a modulus of 70 GPa. A range of indentation loads (50–300 $\mu$N) and residence time (50–900 s) at maximum load were studied. For the measurement parameters used, indentation depths were less than 10% of the film thickness, and therefore substrate effects were not expected to affect the measured values. The effect of indentation load on measured modulus values for a residence time of 300 s is shown in FIG. 7 for the mesoporous silica film. The modulus is in the range of 14–17 GPa for a highly porous film prepared with the $C_{12}EO_{10}$ poyloxyethylene ether surfactant with a porosity of ≅55%. The relative modulus of the porous silica film with respect to dense silica is in reasonable agreement with calculations for porous solids based on either closed or open porosity. The relatively high modulus for the porous film indicates promise for withstanding CMP in interconnect fabrication.

EXAMPLE 2

An experiment was conducted to demonstrate use of various polyoxethelene ether surfactants alone and in combination in preparation of a mesoporous silica film with low dielectric constants. The components of the spin coating solutions including the surfactant type and amount used in each solution, as well as the dielectric constant of selected films are shown in Table E2-1. All the components except for the TEOS were mixed until a homogeneous solution was obtained. In this experiment, the components were added in the following order: surfactant, ethanol, water and acid. When the surfactant was a solid at room temperature, the surfactant was heated to about 30 to 40° C. to melt the surfactant, before adding other solution components. Heating the surfactant is not always necessary, but a homogeneous solution could be more readily obtained by this procedure. TEOS was then added and the solution was stirred. Following addition of TEOS, the solution was aged for 20 hours at room temperature and dispensed onto the surface of polished 4-inch Si wafers by spin-coating at 2000 rpm for 30 seconds using a spin-coater.

The resulting surfactant-templated films were converted to mesoporous film by heating on a series of three hot plates. The highest hot plate temperature was about 400° C. Selected films from this set were subjected to a dehydroxylation procedure including treatment in hexamethyl disilazane solution followed by treatment in 2% $H_2/N_2$ as described previously, and the film dielectric constants measured. The table shows that film dielectric constants of less than 2.25 can be obtained using more than one surfactant.

TABLE E2-1

| Sample # | Composition: Mole Ratio | | | | | | | | |
|---|---|---|---|---|---|---|---|---|---|
| | Teos | H$_2$O | ETOH | HNO$_3$ | Surfactant 1 | | Surfactant 2 | | k' |
| CC24 | 1 | 5 | 10 | 0.05 | 0.1 | C$_{12}$EO$_{10}$ | 0.1 | C$_{16}$EO$_{10}$ | |
| CC25 | 1 | 5 | 10 | 0.05 | 0.13 | C$_{12}$EO$_{10}$ | 0.13 | C$_{16}$EO$_{10}$ | |
| CC26 | 1 | 5 | 10 | 0.05 | 0.15 | C$_{12}$EO$_{10}$ | 0.15 | C$_{16}$EO$_{10}$ | 2.16 |
| CC27 | 1 | 5 | 5 | 0.05 | 0.06 | C$_{12}$EO$_{10}$ | 0.06 | C$_{18}$EO$_{20}$ | |
| CC28 | 1 | 5 | 5 | 0.05 | 0.1 | C$_{12}$EO$_{10}$ | 0.1 | C$_{18}$EO$_{20}$ | 2.11 |
| CC29 | 1 | 5 | 5 | 0.05 | 0.1 | C$_{12}$EO$_{10}$ | 0.1 | C$_{12}$EO$_4$ | |
| CC30 | 1 | 5 | 5 | 0.05 | 0.13 | C$_{12}$EO$_{10}$ | 0.13 | C$_{12}$EO$_4$ | |
| CC31 | 1 | 5 | 5 | 0.05 | 0.15 | C$_{12}$EO$_{10}$ | 0.15 | C$_{12}$EO$_4$ | 2.23 |

EXAMPLE 3

The disordered pore structures of films prepared with polyoxethelene ether surfactants were probed more extensively by low angle x-ray diffraction to determine any characteristic features in the x-ray spectra of these films. The components of the spin coating solutions including the surfactant type and amount used in each solution are shown in Table E3-1. All the components except for the TEOS were mixed until a homogeneous solution was obtained. In this experiment, the components were added in the following order: surfactant, ethanol, water and acid. When the surfactant was a solid at room temperature, the surfactant was heated to about 30 to 40° C. to melt the surfactant, before adding other solution components. Heating the surfactant is not always necessary, but a homogeneous solution could be more readily obtained by this procedure. TEOS was then added and the solution was stirred. Following addition of TEOS, the solution was aged for 20 hours at room temperature and dispensed onto the surface of polished 4-inch Si wafers by spin-coating at 2000 rpm for 30 seconds using a spin-coater.

TABLE E3-1

| | Composition: Mole Ratios | | | | | |
|---|---|---|---|---|---|---|
| Sample # | TEOS | H$_2$O | EtOH | HCl | HNO3 | Surfactant |
| 144-3-I-D | 1 | 5 | 5 | 0.05 | | 0.19 C$_{12}$EO$_{10}$ |
| CC22C | 1 | 5 | 10 | | 0.05 | 0.3 C$_{12}$EO$_{10}$ |
| CC29A | 1 | 5 | 5 | | 0.05 | 0.1 C$_{12}$EO$_{10}$ 0.1 C$_{12}$EO$_4$ |
| CC81-IB | 1 | 5 | 20 | 0.05 | | 0.2 C$_{16}$EO$_{10}$ |
| CC83-IB | 1 | 5 | 20 | 0.05 | | 0.2 C$_{18}$EO$_{10}$ |

The resulting surfactant-templated films were converted to mesoporous films by heating on a series of three hot plates. The highest hot plate temperature was about 400° C. Two films from this set, 143-3-I-D and CC22C were subjected to a dehydroxylation procedure including a treatment in hexamethyl disilazane solution followed by treatment in 2% H$_2$/N$_2$ as described previously.

The films were probed by x-ray diffraction, using the experimental parameters below. X-ray spectra were obtained on a scanned area about 1 cm×1 cm in extent, with the centroid of the scanned area being located about 3.5 cm from the center of the wafer. Spectra were obtained in both the radial and tangential directions of the x-ray beam with respect to the circular wafer.

Figure 8A:
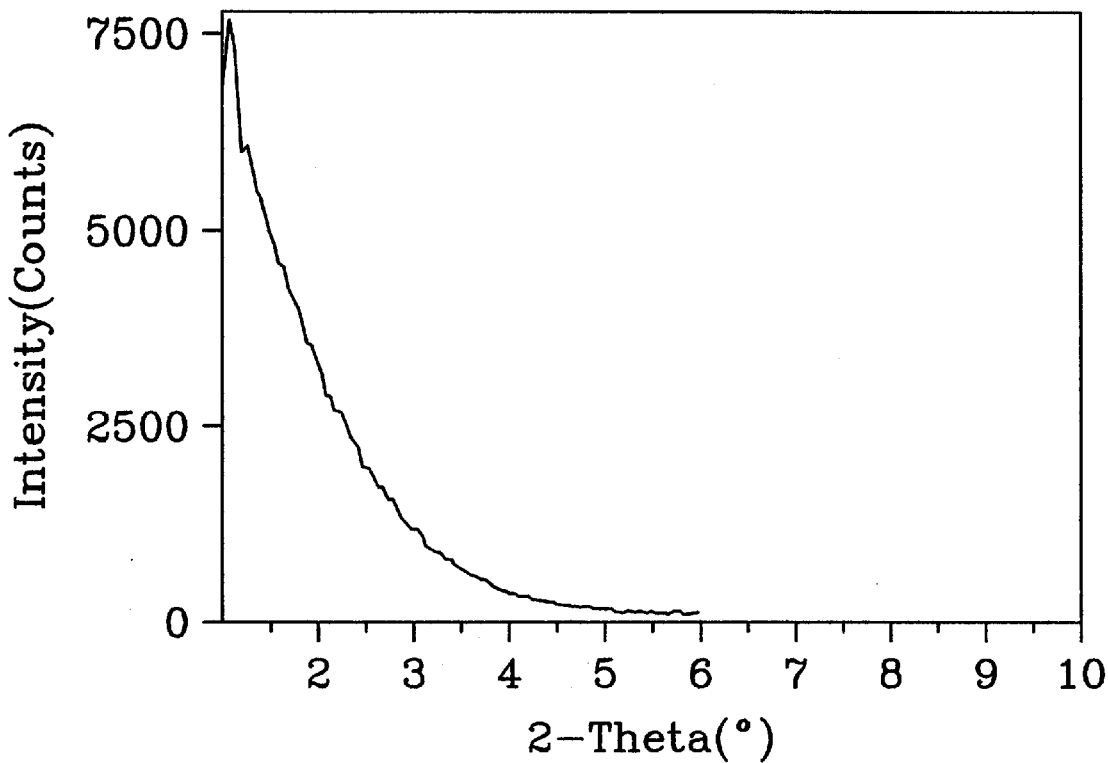
FIG. 8a shows the low angle x-ray diffraction spectrum for mesoporous silica film prepared with a $C_{12}EO_{10}$ polyoxyethylene ether surfactant. Surfactant/TEOS mole ratio was 0.19. The x-ray beam was along the radial direction of the circular wafer.
Figure 8B:
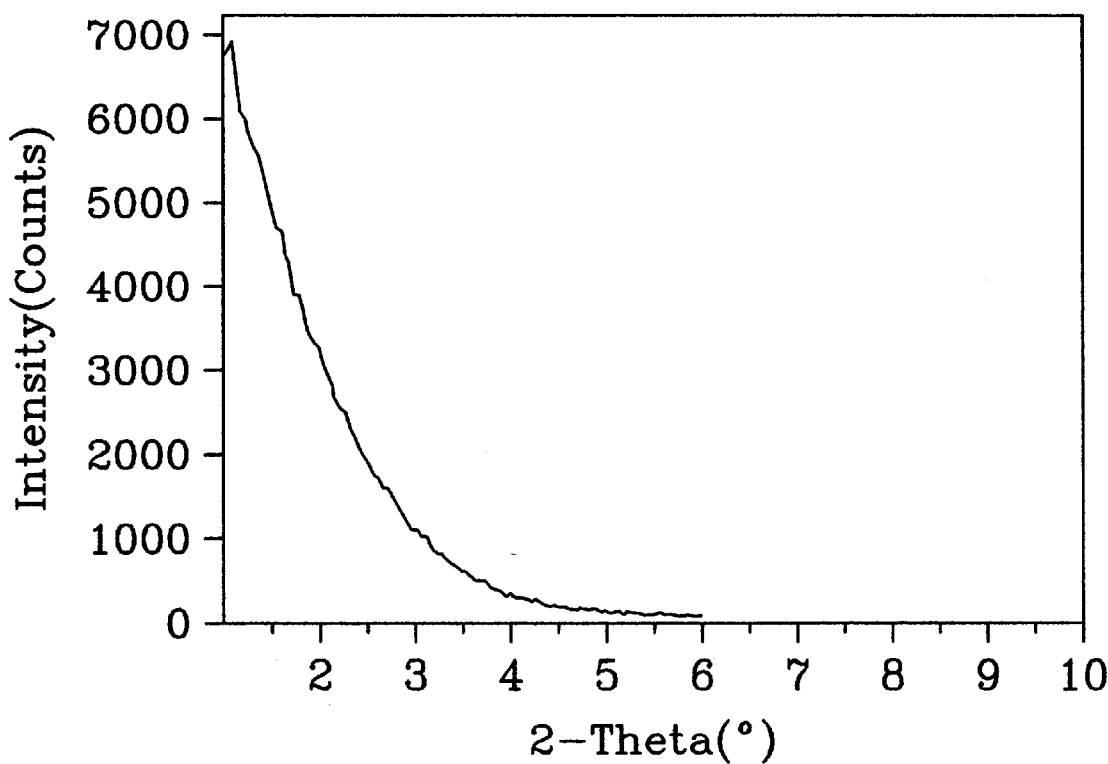
FIG. 8b shows the low angle x-ray diffraction spectrum for mesoporous silica film prepared with a $C_{12}EO_{10}$ polyoxyethylene ether surfactant. Surfactant/TEOS mole ratio was 0.19. The x-ray beam was along the tangential direction of the circular wafer.

Scan Range: 1.00–6.00 deg (2Theta)
Scan Rate: 0.05 deg/10 sec
Scan Type: Continuous (i.e., not Step-Scan)
Diffractometer: Philips X'Pert MPD (Model PW3040/00)
X-ray Source: Sealed Ceramic Tube, Long-Fine Focus (LFF) Cu Anode (Cu K alpha radiation)
X-ray Power: 40 kV, 50 mA (2000 W)
Gonoimeter Radius: 250 mm.
Incident Beam Optics:
  0.04 rad Soller Slit
  Programmable, Automatic Divergence Slit (10 mm spot length)
  10 mm Beam Mask (10 mm spot width)
Receiving Optics:
  0.04 rad Soller Slit
  Programmable, Automatic Anti-Scatter Slit (10 mm spot length)
  Programmable Receiving Slit (0.2 mm)
  Curved Graphite Monochromator
Detector: Xe Proportional Counter 144-3-I-D: X-ray spectra corresponding to the radial and tangential directions are shown in FIG. 8a, FIG. 8b respectively. The intensity of the diffracted or reflected beam steadily increases as lower angles are approached, because a greater percentage of the direct beam reaches the detector, in spite of careful alignment of the system components and control of the sample height relative to the path of the incident and reflected beam. In spite of this increasing intensity, there is evidence of a peak near 1.1 degrees 2-theta in both spectra. Transmission electron microscopy of a thin section of this film showed no evidence of ordered porosity. The areas of the film that were studied did not show any regular geometric arrangement of pores, especially long-range geometric arrangement.

Figure 9A:
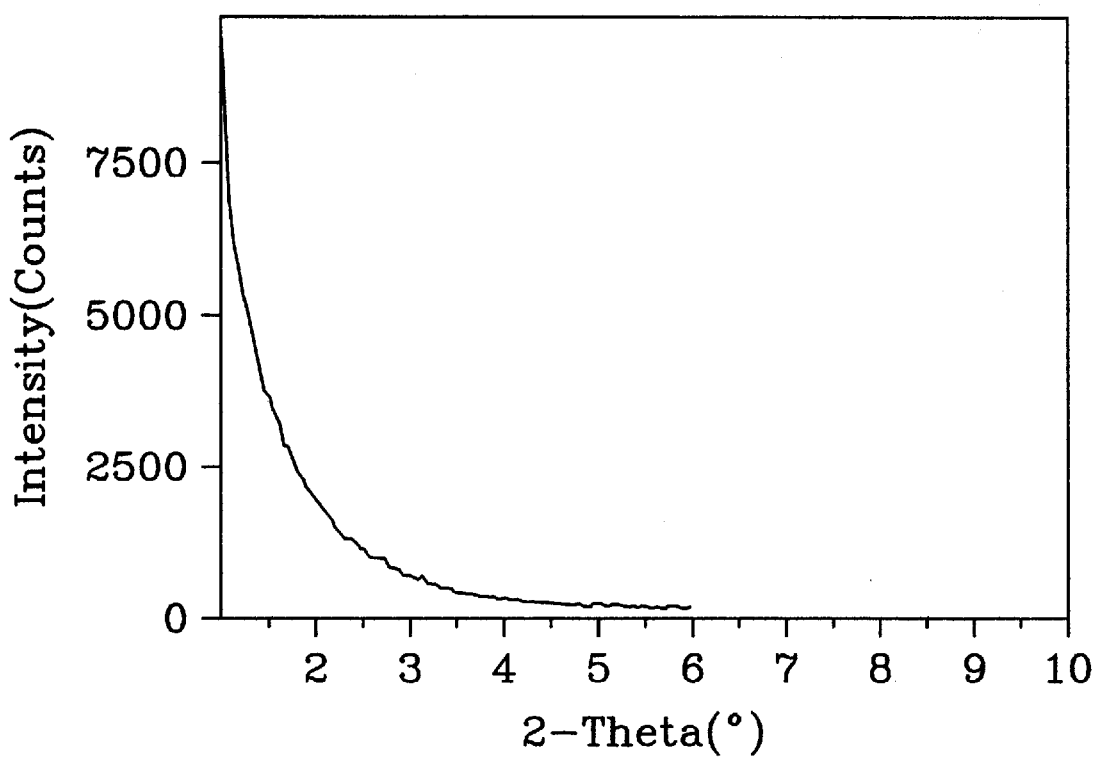
FIG. 9a shows the low angle x-ray diffraction spectrum for mesoporous silica film prepared with a $C_{12}EO_{10}$ polyoxyethylene ether surfactant. Surfactant/TEOS mole ratio was 0.30. The x-ray beam was along the radial direction of the circular wafer.
Figure 9B:
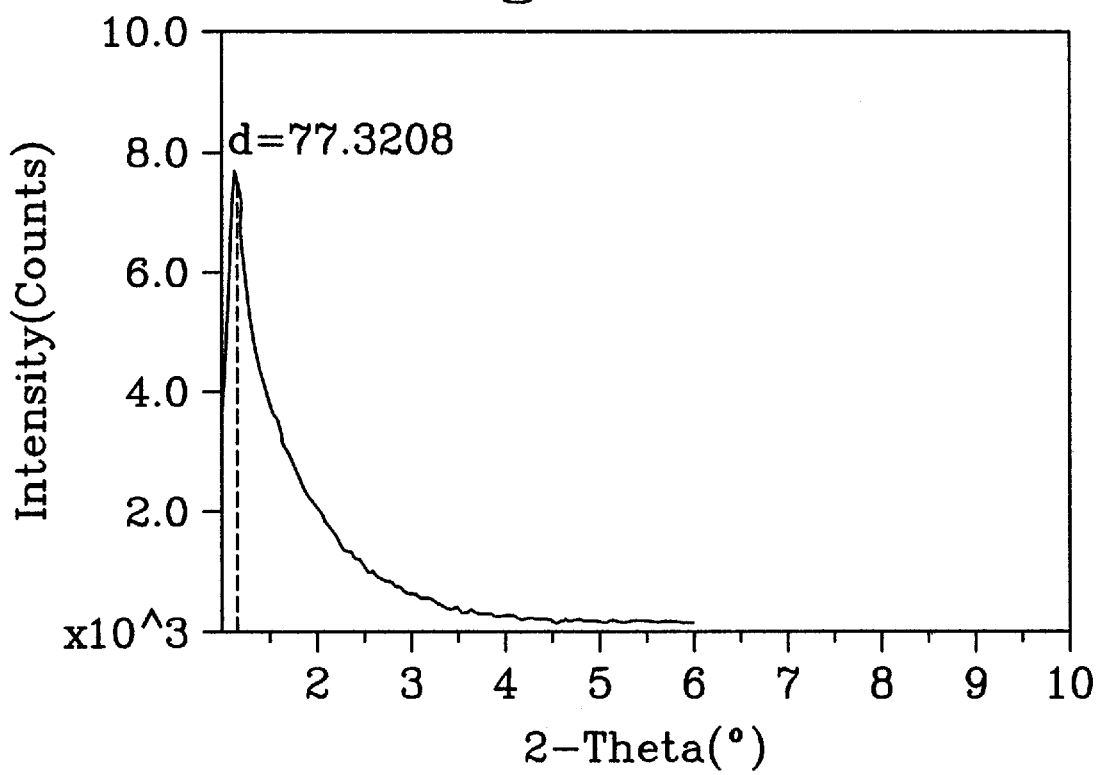
FIG. 9b shows the low angle x-ray diffraction spectrum for mesoporous silica film prepared with a $C_{12}EO_{10}$ polyoxyethylene ether surfactant. Surfactant/TEOS mole ratio was 0.30. The x-ray beam was along the tangential direction of the circular wafer.

CC22C: X-ray spectra corresponding to the radial and tangential directions are shown in FIG. 9a, FIG. 9b respectively. In the tangential directions, there is evidence of a peak at about 1.1 degrees, but in the radial direction, a clear peak is not evident. Only increasing intensity with lower angles is observed.

Figure 10A:
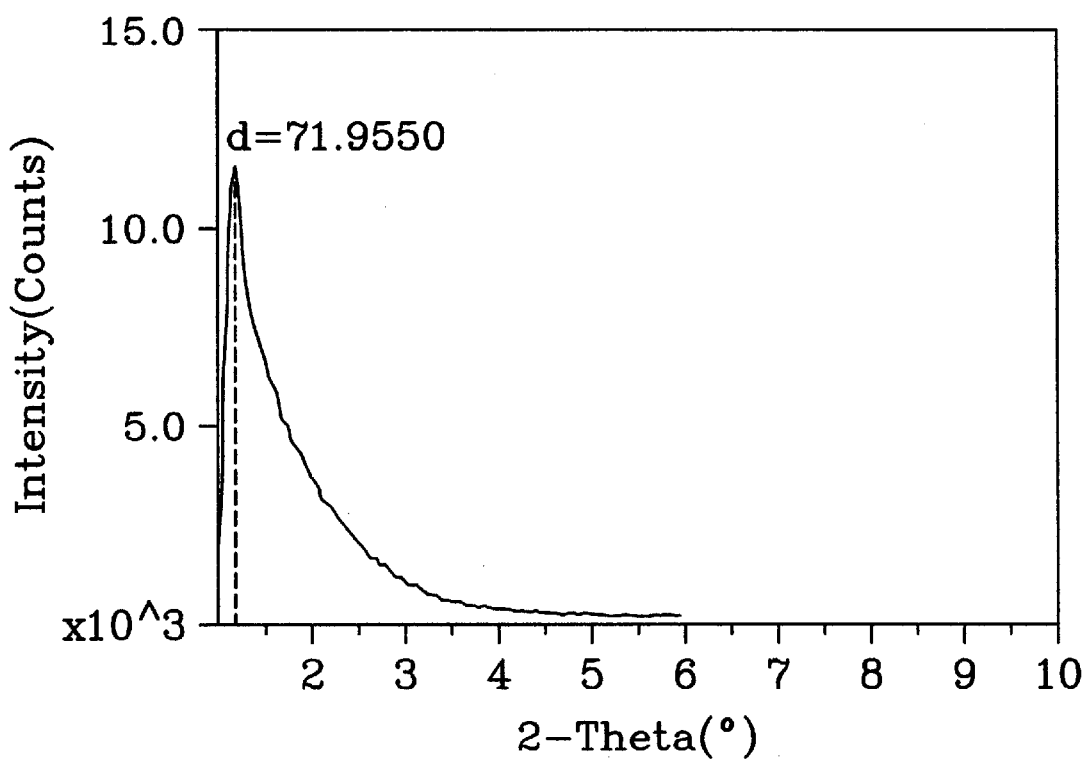
FIG. 10a shows the low angle x-ray diffraction spectrum for mesoporous silica film prepared with a mixture of $C_{12}EO_{10}$ and $C_{12}EO_4$ polyoxyethylene ether surfactant. The total surfactant to TEOS mole ratio was 0.20. The x-ray beam was along the radial direction of the circular wafer.
Figure 10B:
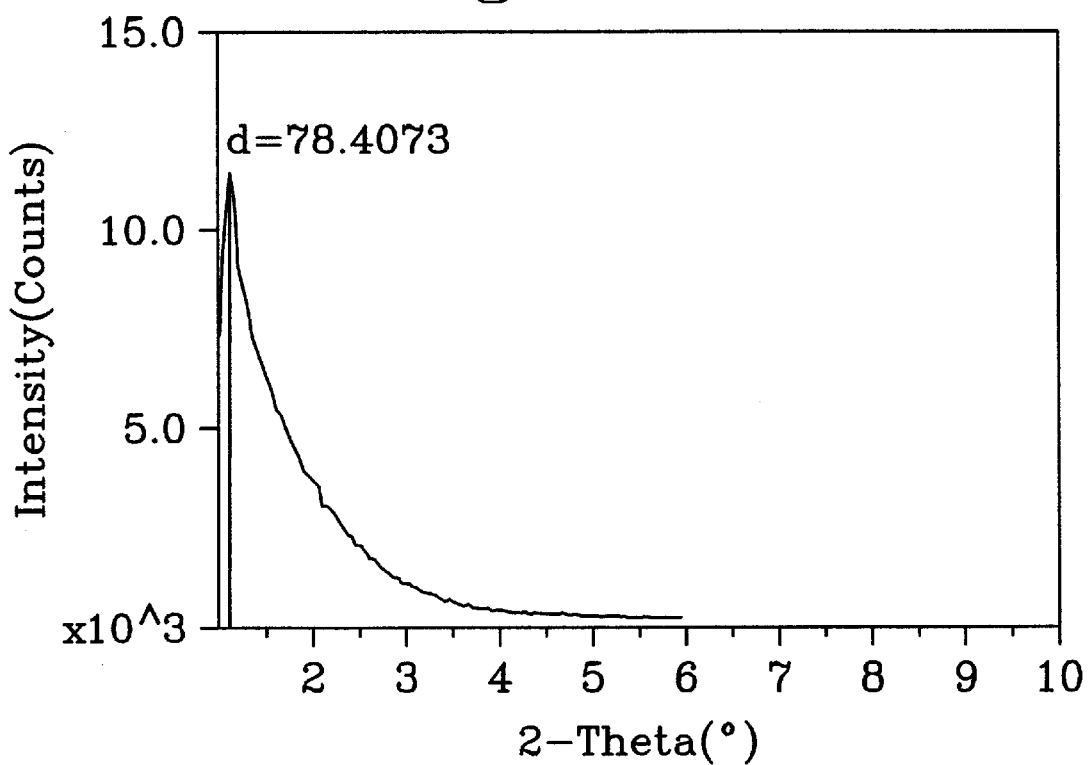
FIG. 10b shows the low angle x-ray diffraction spectrum for mesoporous silica film prepared with a mixture of $C_{12}EO_{10}$ and $C_{12}EO_4$ polyoxyethylene ether surfactant. The total surfactant to TEOS mole ratio was 0.20. The x-ray beam was along the tangential direction of the circular wafer.

CC29C: X-ray spectra corresponding to the radial and tangential directions are shown in FIG. 10a, FIG. 10b respectively. In both the radial and the tangential directions, there is evidence of a peak at about 1.1 to 1.2 degrees 2-theta.

Figure 11A:
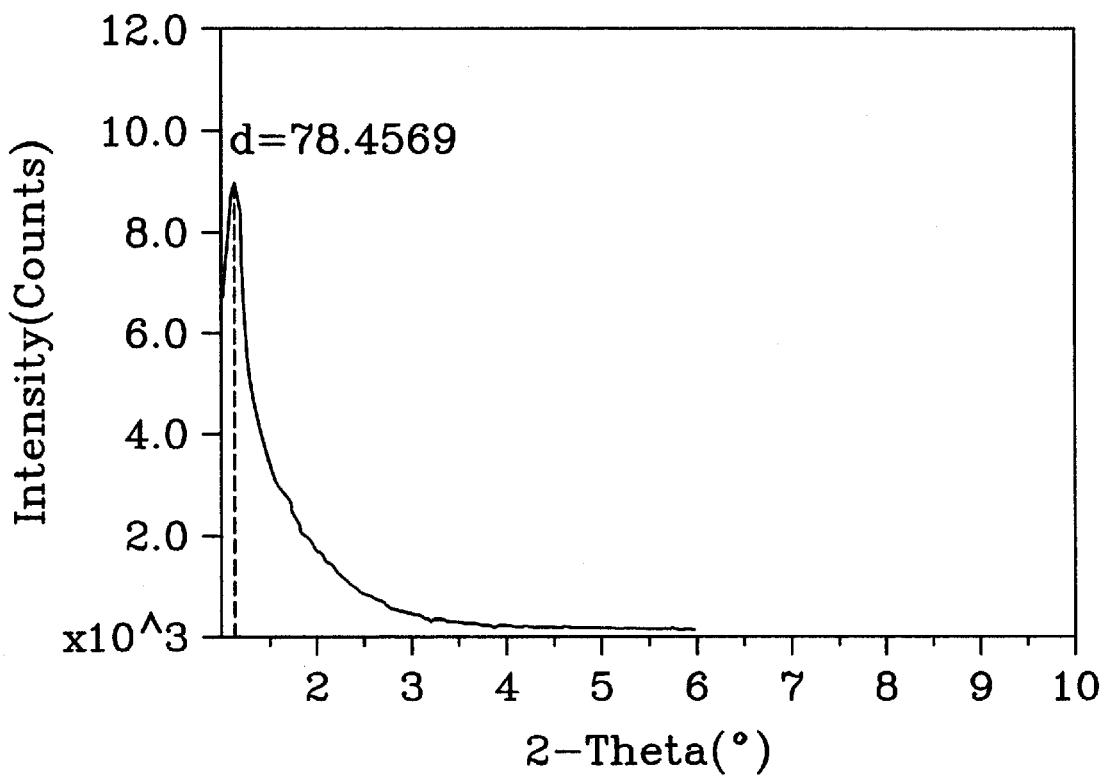
FIG. 11a shows the low angle x-ray diffraction spectrum for mesoporous silica film prepared with a $C_{16}EO_{10}$ polyoxyethylene ether surfactant. Surfactant/TEOS mole ratio was 0.20. The x-ray beam was along the radial direction of the circular wafer.
Figure 11B:
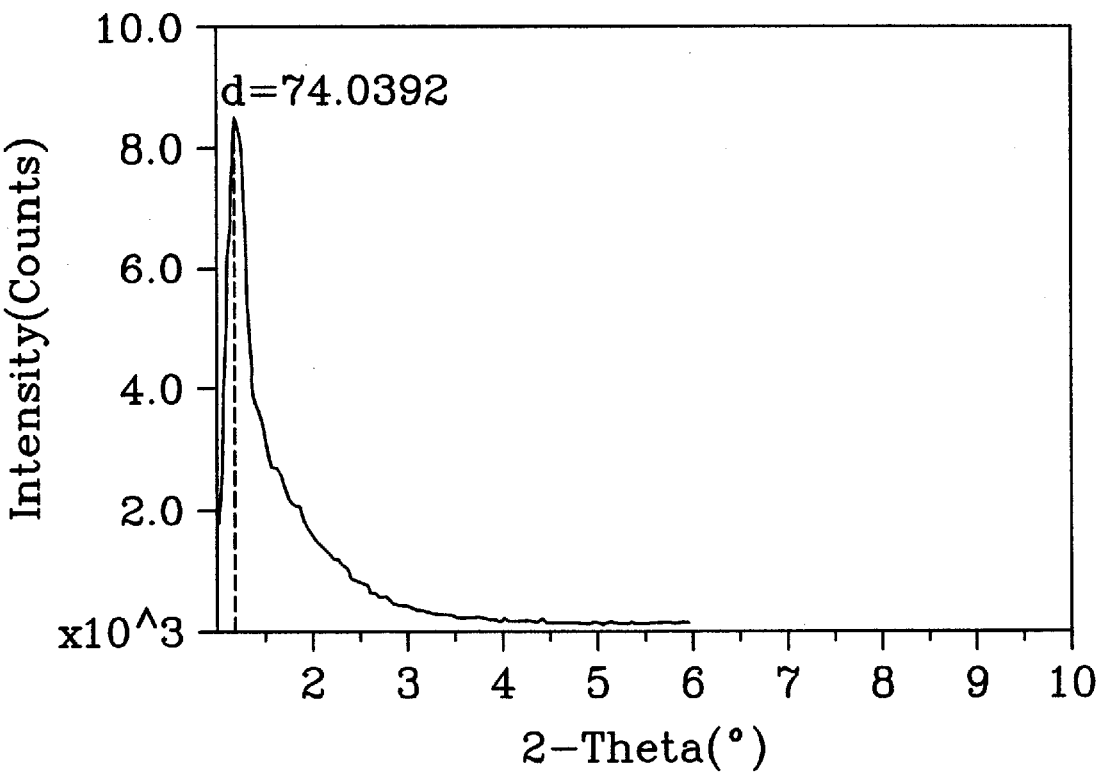
FIG. 11b shows the low angle x-ray diffraction spectrum for mesoporous silica film prepared with a $C_{16}EO_{10}$ polyoxyethylene ether surfactant. Surfactant/TEOS mole ratio was 0.20. The x-ray beam was along the tangential direction of the circular wafer.

CC81-1B: X-ray spectra corresponding to the radial and tangential directions are shown in FIG. 11a, FIG. 11b respectively. In both the radial and the tangential directions, there is evidence of a peak at about 1.1 to 1.2 degrees 2-theta.

Figure 12A:
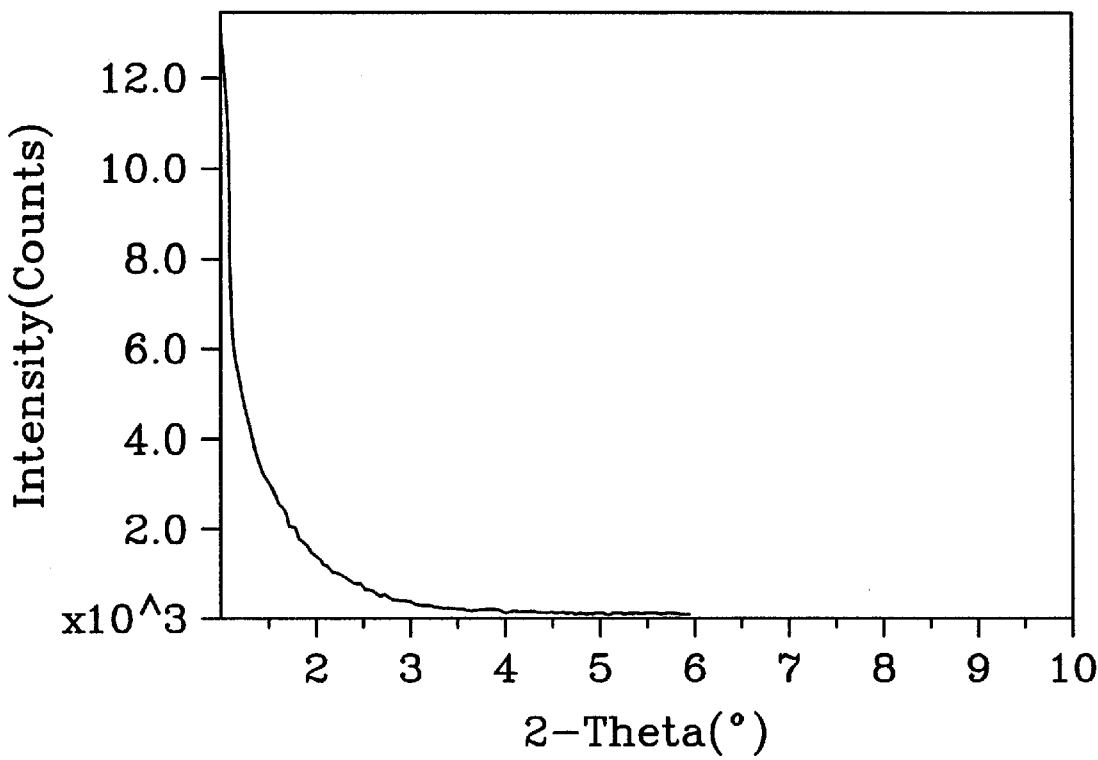
FIG. 12a shows the low angle x-ray diffraction spectrum for mesoporous silica film prepared with a $C_{18}EO_{10}$ polyoxyethylene ether surfactant. Surfactant/TEOS mole ratio was 0.20. The x-ray beam was along the radial direction of the circular wafer.
Figure 12B:
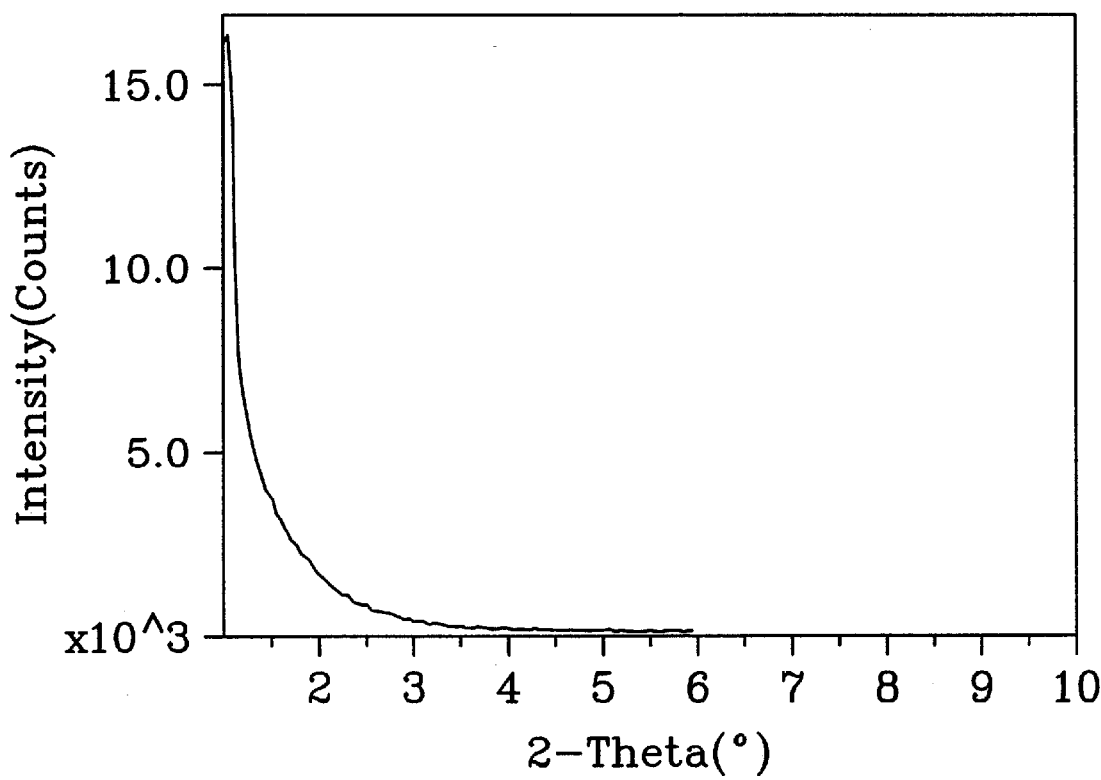
FIG. 12b shows the low angle x-ray diffraction spectrum for mesoporous silica film prepared with a $C_{18}EO_{10}$ polyoxyethylene ether surfactant. Surfactant/TEOS mole ratio was 0.20. The x-ray beam was along the tangential direction of the circular wafer.
Figure 12C:
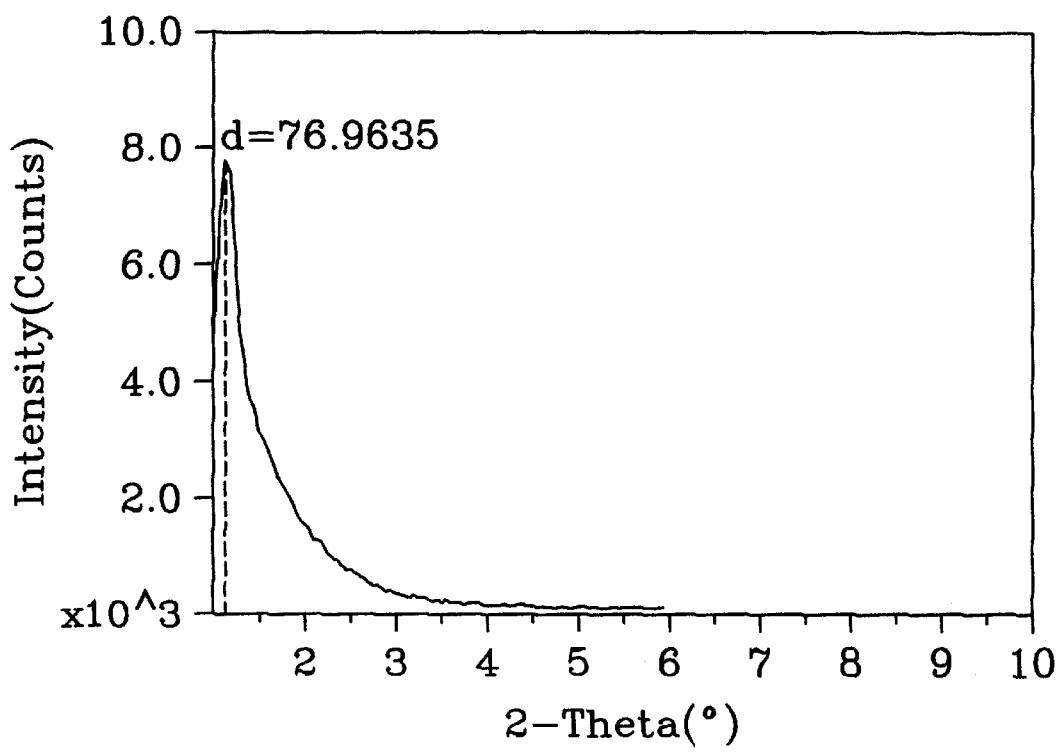
FIG. 12c shows the low angle x-ray diffraction spectrum for mesoporous silica film prepared with a $C_{18}EO_{10}$ polyoxyethylene ether surfactant. Surfactant/TEOS mole ratio was 0.20. The x-ray beam was along the radial direction of the circular wafer. The area scanned was located about 90 degrees (rotation) away from the area scanned in FIG. 12a and b.
Figure 12D:
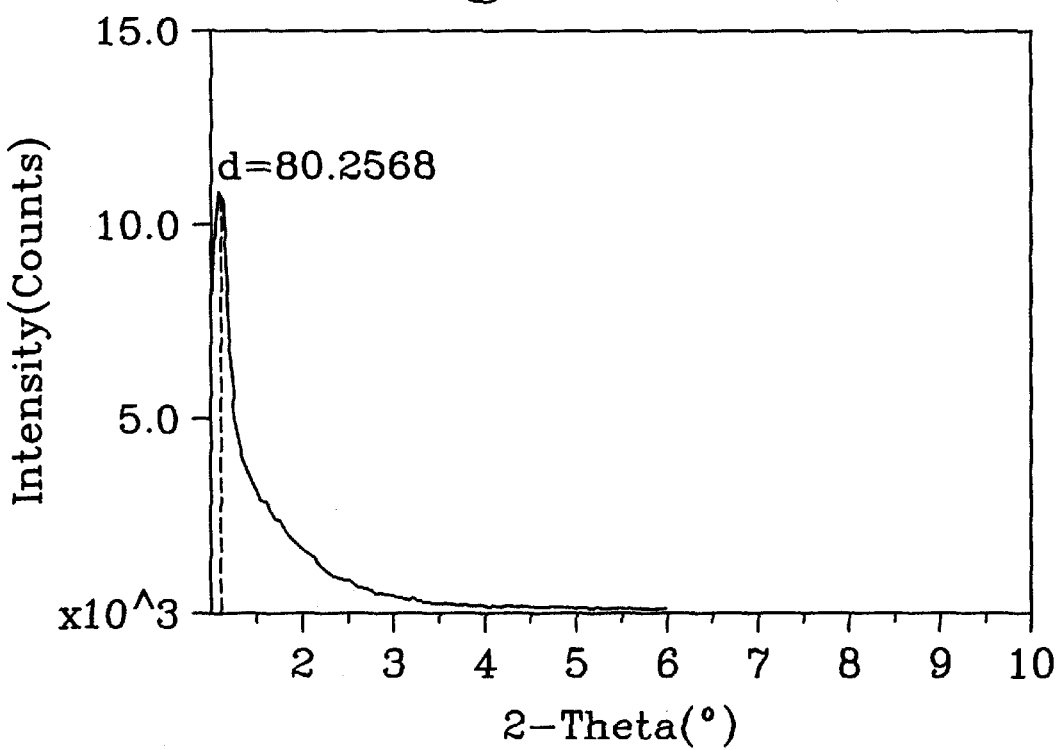
FIG. 12d shows the low angle x-ray diffraction spectrum for mesoporous silica film prepared with a $C_{18}EO_{10}$ polyoxyethylene ether surfactant. Surfactant/TEOS mole ratio was 0.20. The x-ray beam was along the tangential direction of the circular wafer. The area scanned was located about 90 degrees (rotation) away from the area scanned in FIG. 12a and b.

CC83-1B: Two sets of x-ray spectra obtained on this sample are shown in FIGS. 12a–12d. One set (radial and tangential direction) was obtained about a quarter-wafer away (about 90 degrees rotation of the wafer) from the other. In FIGS. 12a, 12b, the spectra obtained in the radial and tangential direction in one area do not show clear evidence of a peak at low angles. However, each of the spectra in FIGS. 12c, 12d from the other area on the sample contains a single peak at around 1.1–1.2 degrees 2-theta. Transmission electron microscopy of a thin section of this film showed no evidence of ordered porosity. The areas of the film that were studied did not show any regular geometric arrangement of pores, especially long-range geometric arrangement.

The observations concerning x-ray reflections at low angle and transmission electron microscopy in this example, in combination with the observations concerning x-ray reflections and the microstructure by TEM in Example 1 are consistent with a pore structure that does not have any ordered geometric "crystalline" arrangement, especially long range. This disordered porosity was characterized by an X-ray diffraction peak at very low angles (about 0.75 to about 2 degrees 2- theta). It is to be noted that this peak is not observed 100% of the time for disordered porosity.

EXAMPLE 4

Dehydroxylation of mesoporous silica films utilizing a silane in the vapor form at room temperature can produce dielectric constants less than 2.5. A mesoporous film on a silicon wafer was placed in a stainless steel reaction vessel having an internal volume of ~0.081 cm$^3$. The reaction vessel (equipped with inlet and outlet high temperature valves) was connected to a high vacuum line via vacuum tubing. The reactor was placed in a sand bath and temperatures were monitored employing thermocouples deployed uniformly about the reactor. The initial heating up step (0 min. to 2 hrs) was conducted with the chamber placed under high vacuum (~$10^{-5}$ torr). After the reaction chamber had achieved the desired temperature it was opened to the silane in vapor phase. The pressure of the silane vapor was dependent on the silane's vapor pressure at or near its boiling point. After the desired time had elapsed the chamber was placed under vacuum. The treatments of the mesoporous films essentially consisted of a vacuum treatment followed by one or more silane treatments in vapor phase followed by one or more vacuum treatments at temperatures ranging from 298 to 723K (25C to 450C). Vacuum treatments and silane treatments were varied in duration from 5 minutes to 2 hours. This procedure was repeated for a number of cycles for the samples illustrated in Table E4-1. Upon cooling, the wafer was removed from the reaction vessel and, following deposition of gold electrodes on the surfaces, was placed in a tube furnace and treated with forming gas (2%$H_2$/$N_2$) at 673K (400C) for two hours. The capacitance of the film was measured under ambient conditions. The films were also placed in a flow of dry nitrogen gas and film capacitance measured. Finally the wafer was placed in a sealed glass container containing a beaker of water to simulate 100% relative humidity for time periods ranging from 1 to 3 days, and the sample then was removed and the capacitance measured again in room air. Several different silanes were investigated, including trimethyl iodosilane, trimethyl chlorosilane, dimethyl dimethoxy silane, and hexamethyl disilazane. The results of experiments with trimethyl iodosilane and hexamethyl disilazane are set forth in Table E4-1. These results illustrate that, depending on the silane and the treatment conditions employed, low dielectric constants (<2.5) on mesoporous silica films can be achieved with a procedure that includes an exposure of the mesoporous silica film to silane. This exposure may occur in high humidity conditions. These results indicate that dehydroxylation by silanes may be most effective with a procedure that includes removal of gas-phase or physisorbed species in the porous film before and/or after the silane treatment step. This removal of gas-phase or physisorbed species was carried out by treatment in vacuum or by treatment in flowing forming gas, but may also be accomplished by treatment in other flowing inert gases such as high purity nitrogen or argon.

TABLE E4-1

| Sample # | Silane (pressure in torr) | Total Mmole silane | Temp. °C. | Time* (min) | Number of cycles (silane treatment) | K' (in air) | K' (in flowing nitrogen) | K' (in air, after 100% humidity)** |
|---|---|---|---|---|---|---|---|---|
| JB-3 | $(CH_3)_3SiI$ 36 torr | 0.16 | 275 | 60 | 1 | 1.66 | 1.57 | 1.91 |
| JB-6 | $(CH_3)_3SiI$ 30 torr | 0.17 | 400 | 10 | 3 | 1.73 | 1.65 | 1.72 |
| JB-8 | HMDS*** 19 torr | 0.17 | 350 | 10 | 5 | 1.77 | 1.67 | 1.86 |

*Silane treatment time, in minutes. Generally, vacuum time is the same.
**Exposure to 100% humidity for ~15 hours, capacitance immediately measured thereafter in ambient air.
***Hexamethyl disilazane It is believed that such treatment may be best accomplished in a chamber wherein the film temperature can be controlled, and where the required gases can be fed into the chamber in the proper sequence, and the chamber pumped down in vacuum before and/or after silane exposure. We designed an experimental reaction chamber to be used for dehydroxylation of mesoporous silica films supported on silicon wafers which could be an independent chamber or part of an integrated spin-track tool. The stainless steel chamber is constructed to hold 4, 6, 8 and 12 inch wafers. Under high vacuum the chamber will support an outer pressure of one atmosphere, and the cooled seal on the front-opening door will maintain a vacuum of $10^{-5}$ torr. The internal self-heating shelves will heat to 500C, and internal circulation is assured with a fan. After an initial vacuum treatment, a gaseous silane is pumped into the chamber at the desired pressure, and thereafter a vacuum is again applied. The cycle may be repeated as many times as necessary to achieve the desired degree of dehydroxylation. After the last vacuum treatment, forming or an inert gas is pumped into the chamber.

EXAMPLE 5

Mono- and di-alkyl substituted alkoxysilanes can be used as additional silica precursors in the surfactant-containing spin coating solution used to prepare low dielectric constant mesoporous silica films with dielectric constants of <2.5. A series of solutions were prepared as described in example 1 except that methyl triethoxysilane and dimethyl dimethoxysilane were added to the one mole ratio of tetraethoxysilane. Molar ratios of 0.95:0.05 to 0.25:0.75 of TEOS to the alkyl-ethoxysilane respectively were prepared. The surfactant used was 10 lauryl ether. The surfactant to silica precursor mole ratio was 0.17. Silicon wafers were spin coated with these solutions and heat-treated as described in example 2. Selected coated wafers were subjected to the dehydroxylation treatment as follows. The coated silicon wafer was placed in a stainless steel reaction vessel having an internal volume of ~0.081 cm$^3$. The reaction vessel (equipped with inlet and outlet high temperature valves) was connected to a high vacuum line via vacuum tubing. The reactor was placed in a sand bath and temperatures were monitored employing thermocouples deployed uniformly about the reactor. The initial heating up step (0 min. to 2 hrs) was conducted with the chamber placed under high vacuum (~10$^{-5}$ torr). After the reaction chamber had achieved the desired temperature it was opened to the silane in vapor phase. The pressure of the silane vapor was dependent on the silane's vapor pressure at or near its boiling point. After the desired time had elapsed the chamber was placed under vacuum. The treatments of the mesoporous films essentially consisted of a vacuum treatment followed by one or more silane treatments in vapor phase followed by one or more vacuum treatments at temperatures ranging from 298 to 723K (25C to 450C). Vacuum treatments and silane treatments were varied in duration from 5 minutes to 2 hours. Upon cooling, the wafer was removed from the reaction vessel and gold electrodes deposited on the surfaces. The capacitance of the film was measured under ambient conditions. The films were also placed in a flow of dry nitrogen gas and film capacitance measured. The results of one wafer are given in Table E5-1.

TABLE E5-1

| Sample # | Siloxane molar ratio | Dehydroxylation silane (pressure) | Total mmol silane | Time (min) | Temp (° C.) | No. of cycles | K' Air | K' nitrogen |
|---|---|---|---|---|---|---|---|---|
| JB-21 | 0.85 TEOS 0.15 Methyl triethoxide | (CH3)3SiI 17 torr | 0.23 | 10 | 390 | 5 | 2.24 | 2.23 |

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method of making a mesoporous film comprising the steps of:
   (a) combining a silica precursor with an aqueous solvent, a catalyst and a surfactant into a precursor solution;
   (b) spin coating said precursor solution into a templated film;
   (c) removing said aqueous solvent, said catalyst and said surfactant from said templated film to form a hydroxylated film; and
   (d) dehydroxylating said hydroxylated film to obtain said mesoporous film, said mesoporous film having a porosity that is disordered, said disorder being characterized by an absence of a major x-ray diffraction peak in the range of 2 to 6 degrees 2-theta.

2. The method as recited in claim 1, wherein said surfactant is a polyoxyethylene ether surfactant.

3. The method as recited in claim 2, wherein said polyoxyethylene ether surfactant is $C_{12}H_{25}$ $(CH_2CH_2O)_{10}OH$ also known as $C_{12}EO_{10}$ or 10 lauryl ether; $C_{16}H_{33}$ $(CH_2CH_2O)_{10}OH$ also known as $C_{16}EO_{10}$ or 10 cetyl ether; $C_{18}H_{37}$ $(CH_2CH_2O)_{10}OH$ also known as $C_{18}EO_{10}$ or 10 stearyl ether, $C_{12}H_{25}(CH_2CH_2O)_4OH$ also known as $C_{12}EO_4$ or 4 lauryl ether; $C_{16}H_{33}(CH_2CH_2O)_2OH$ also known as $C_{16}EO_2$ or 2 cetyl ether or combinations thereof.

4. The method as recited in claim 1, wherein said surfactant is in combination with organic co-solvents and with a chemical agent selected from the group consisting of a second surfactant, smaller hydrophilic molecular compounds characterized by molecular weights of less than or equal to approximately 1150.

5. The method as recited in claim 4, wherein said second surfactant is selected from the group consisting of non-ionic surfactant, catonic surfactant, anionic surfactant, amphoteric surfactant and combinations thereof.

6. The method as recited in claim 5, wherein said cationic surfactant is an ammonium-based surfactant.

7. The method as recited in claim 4, wherein said smaller hydrophilic molecular compounds are selected from the group consisting of glycerol, propylene glycol, and ethylene glycol.

8. The method as recited in claim 4, wherein said organic co-solvents are selected from the group consisting of mesitylene, octane and combinations thereof.

9. The method as recited in claim 1, wherein said silica precursor is selected from the group consisting of tetraethyl orthosilicate (TEOS), tetramethyl orthosilicate (TMOS), methyl triethoxysilane, phenyl triethoxy silane, dimethyl dimethoxy silane, ethyl triethyoxysilane, and combinations thereof.

10. The method as recited in claim 1, wherein said aqueous solvent comprises ethanol and water.

11. The method as recited in claim 1, wherein said catalyst is selected from the group consisting of inorganic acid, organic acid and combinations thereof.

12. The method as recited in claim 1, wherein said precursor solution includes at least one other surfactant.

13. The method as recited in claim 12, wherein said at least one other surfactant is selected from the group consisting of non-ionic surfactant, cationic surfactant, anionic surfactant, amphoteric surfactant and combinations thereof.

14. The method as recited in claim 1, wherein dehydroxylating occurs in the presence of a silicon-based organic compound in the vapor phase.

15. The method as recited in claim 14, wherein the silicon-based organic compound is a silane.

16. The method as recited in claim 15, wherein the silane is selected from the group consisting of trimethyl iodosilane, trimethyl chlorosilane, dimethyl dimethoxy silane, demethyl dichloro silane, hexaphenyl disilazane, diphenyl tetramethyl silazane and hexamethyl disilazane.

17. A method of making a mesoporous film comprising the steps of:
(a) combining a silica precursor with an aqueous solvent, a catalyst and a surfactant into a precursor solution, wherein said precursor solution includes at least one smaller hydrophilic molecular compound characterized by a molecular weight that is less than that of said surfactant;
(b) spin coating said precursor solution into a templated film;
(c) removing said aqueous solvent, said catalyst and said surfactant from said templated film and forming a hydroxylated film with disordered porosity; and
(d) dehydroxylating said hydroxylated film and obtaining said mesoporous film.

18. The method as recited in claim 17, wherein said at least one smaller hydrophilic molecular compound is selected from the group consisting of glycerol, propylene glycol, ethylene glycol and combinations thereof.

19. A method of making a mesoporous film comprising the steps of:
(a) combining a silica precursor with an aqueous solvent, a catalyst and a surfactant into a precursor solution, wherein said precursor solution includes at least one organic co-solvent;
(b) spin coating said precursor solution into a templated film;
(c) removing said aqueous solvent said catalyst and said surfactant from said templated film and forming a hydroxylated film with disordered porosity; and
(d) dehydroxylating said hydroxylated film and obtaining said mesoporous film.

20. The method as recited in claim 19, wherein said at least one organic co-solvent is selected from the group consisting of mesitylene, octane and combinations thereof.

21. A method of making a mesoporous film with a surfactant containing solution, the method comprising the steps of:
(a) combining a silica precursor with an aqueous solvent, a catalyst and a surfactant that is a polyoxethylene ether surfactant into a precursor solution;
(b) spin coating said precursor solution into a templated film;
(c) removing said aqueous solvent said catalyst and said surfactant to form a hydroxylated mesoporous film characterized by a porosity that is disordered as indicated by an absence of a major x-ray diffraction peak in the range of 2 to 6 degrees 2-theta; and
(d) dehydroxylating said hydroxylated film to obtain said mesoporous film.

22. The method as recited in claim 21, wherein said polyoxyethylene ether surfactant is $C_{12}H_{25}$ $(CH_2CH_2O)_{10}OH$ also known as $C_{12}EO_{10}$ or 10 lauryl ether; $C_{16}H_{33}$ $(CH_2CH_2O)_{10}OH$ also known as $C_{16}EO_{10}$ or 10 cetyl ether; $C_{18}H_{37}$ $(CH_2CH_2O)_{10}OH$ also known as $C_{18}EO_{10}$ or 10 stearyl etler; $C_{12}H_{25}(CH_2CH_2O)_4OH$ also known as $C_{12}EO_4$ or 4 lauryl ether; $C_{16}H_{33}(CH_2CH_2O)_2OH$ also known as $C_{16}EO_2$ or 2 cetyl ether or combinations thereof.

23. The method as recited in claim 21, wherein said precursor solution includes at least one other surfactant.

24. The method as recited in claim 21, wherein said precursor solution includes an agent selected from the group consisting of a second surfactant, a smaller hydrophilic molecular compound characterized by a molecular weight of less than or equal to approximately 1150, an organic co-solvent and combinations thereof.

25. The method as recited in claim 23, wherein said at least one other surfactant is selected from the group consisting of non-ionic surfactant, cationic surfactant, anionic surfactant, amphoteric surfactant and combinations thereof.

26. The method as recited in claim 24, wherein said second surfactant is selected from the group consisting of non-ionic surfactant, cationic surfactant, anionic surfactant, amphoteric surfactant and combinations thereof.

27. The method as recited in claim 24, wherein said smaller hydrophilic molecular compound is selected from the group consisting of glycerol, propylene glycol, ethylene glycol and combinations thereof.

28. The method as recited in claim 24, wherein said organic co-solvent is selected from the group consisting of mesitylene, octane and combinations thereof.

29. The method as recited in claim 21 wherein said silica precursor is selected from the group consisting of tetraethyl orthosilicate (TEOS), tetramethyl orthosilicate, methyl triethoxysilane, phenyl triethoxy silane, dimethyl dimethoxy silane and combinations thereof.

30. The method as recited in claim 21 wherein said aqueous solvent includes ethanol.

31. The method as recited in claim 21, wherein said catalyst is selected from the group consisting of inorganic acid, organic acid and combinations thereof.

32. The method as recited in claim 21, wherein dehydroxylating occurs in the presence of a silicon-based organic compound in the vapor phase.

33. The method as recited in claim 32, wherein the silicon-based organic compound is a silane.

34. The method as recited in claim 33, wherein the silane is selected from the group consisting of trimethyl iodosilane, trimethyl chlorosilane, dimethyl dichloro silane, hexaphenyl disilazane, diphenyl tetramethyl silazane and hexamethyl disilazane.

35. A method of making a mesoporous film with a surfactant containing solution, the method comprising the steps of:
(a) combining a silica precursor with an aqueous solvent, a catalyst and a surfactant that is a polyoxethylene ether surfactant into a precursor solution;
(b) spin coating said precursor solution into a templated film;
(c) removing said aqueous solvent, said catalyst and said surfactant forming a hydroxylated film having porosity; and
(d) dehydroxylating said hydroxylated film and obtaining said mesoporous film, wherein said porosity is disordered as indicated by an absence of a major x-ray diffraction peak in the range of 2 to 6 degrees 2-theta.

36. A method of making a mesoporous film with a surfactant containing solution, the method comprising the steps of:
(a) combining a silica precursor wit) an aqueous solvent, a catalyst and a surfactant that is a polyoxethylene ether surfactant into a precursor solution;
(b) spin coating said precursor solution into a templated film;
(c) removing said aqueous solvent, said catalyst and said surfactant forming a hydroxylated film having porosity; and
(d) dehydroxylating said hydroxylated film and obtaining said mesoporous film, wherein said porosity is disordered, lacking a regular geometric arrangement of pores, and the pore structure is characterized by a major x-ray diffraction peak between about 0.75 and about 2 degrees 2-theta.

37. A method of making a mesoporous film with a surfactant containing solution, the method comprising the steps of:
(a) combining a silica precursor with an aqueous solvent, a catalyst and a surfactant that is a polyoxethylene ether surfactant into a precursor solution;
(b) spin coating said precursor solution into a templated film;
(c) removing said aqueous solvent said catalyst and said surfactant forming a hydroxylated film having porosity; and
(d) dehydroxylating said hydroxylated film and obtaining said mesoporous film, wherein said precursor solution includes at least one smaller hydrophilic molecular compound characterized by a molecular weight that is less than that of said surfactant.

38. The method as recited in claim 37, wherein said at least one smaller hydrophilic molecular compound is selected from the group consisting of glycerol, propylene glycol, ethylene glycol and combinations thereof.

39. A method of making a mesoporous film with a surfactant containing solution, the method comprising the steps of:
(a) combining a silica precursor with an aqueous solvent, a catalyst and a surfactant that is a polyoxethylene ether surfactant into a precursor solution;
(b) spin coating said precursor solution into a templated film;
(c) removing said aqueous solvent said catalyst and said surfactant forming a hydroxylated film having porosity; and
(d) dehydroxylating said hydroxylated film and obtaining said mesoporous film, wherein said precursor solution includes at least one organic co-solvent.

40. The method as recited in claim 39, wherein said at least one organic co-solvent is selected from the group consisting of mesitylene, octane and combinations thereof.

41. A method of making a mesoporous film with a surfactant containing solution, the method comprising the steps of:
(a) combining a silica precursor with an aqueous solvent, a catalyst and a surfactant that is a polyoxethylene ether surfactant into a precursor solution;
(b) spin coating said precursor solution into a templated film;
(c) removing said aqueous solvent, said catalyst and said surfactant forming a hydroxylated film having porosity; and
(d) dehydroxylating said hydroxylated film and obtaining said mesoporous film, wherein said catalyst is a carboxylic acid selected from the group consisting of methanoic acid (formic acid), ethanoic acid (acetic acid), ethandioic acid (oxalic acid), butanoic acid (butyric acid), and combinations thereof.

42. A method of making a mesoporous film comprising the steps of:
(a) combining a silica precursor with an aqueous solvent, an acid and a polyoxethylene other surfactant into a precursor solution;
(b) spincoating said precursor solution into a templated film;
(c) removing said aqueous solvent, said acid and said surfactant to form a hydroxylated film characterized by a porosity that is disordered as indicated by an absence of a major x-ray diffraction peak in the range of 2 to 6 degrees 2-theta; and
(d) dehydroxylating said hydroxylated film to obtain said mesoporous film.

43. The method as recited in claim 42, wherein said polyoxyethylene ether surfactant is $C_{12}H_{25}$ $(CH_2CH_2O)_{10}OH$ also known as $C_{12}EO_{10}$ or 10 lauryl ether; $C_{16}H_{33}$ $(CH_2CH_2O)_{10}OH$ also known as $C_{16}EO_{10}$ or 10 cetyl ether; $C_{18}H_{37}$ $(CH_2CH_2O)_{10}OH$ also known as $C_{18}EO_{10}$ or 10 stearyl ether, $C_{12}H_{25}(CH_2CH_2O)_4OH$ also known as $C_{12}EO_4$ or 4 lauryl ether; $C_{16}H_{33}(CH_2CH_2O)_2OH$ also known as $C_{16}EO_2$ or 2 cetyl ether or combinations thereof.

44. The method as recited in claim 42, wherein said silica precursor is tetraethyl orthosilicate (TEOS).

45. The method as recited in claim 42, wherein said aqueous solvent comprises ethanol and water.

46. The method as recited in claim 42, wherein said acid is hydrochloric acid.

47. A method of making a mesoporous film comprising the steps of:
(a) combining a silica precursor with an aqueous solvent, an acid and a polyoxethylene ether surfactant into a precursor solution;
(b) spin-coating said precursor solution into a templated film;
(c) removing said aqueous solvent, said acid and said surfactant forming a hydroxylated film; and
(d) dehydroxylating said hydroxylated film and obtaining said mesoporous film, wherein said polyoxyethylene ether surfactant is $C_{12}H_{25}$ $(CH_2CH_2O)_{10}OH$ also known as $C_{12}EO_{10}$ or 10 lauryl ether; $C_{16}H_{33}$ $(CH_2CH_2O)_{10}OH$ also known as $C_{16}EO_{10}$ or 10 cetyl ether; $C_{18}H_{37}$ $(CH_2CH_2O)_{10}OH$ also known as $C_{18}EO_{10}$ or 10 stearyl ether; $C_{12}H_{25}(CH_2CH_2O)_4OH$ also known as $C_{12}EO_4$ or 4 lauryl ether; $C_{16}H_{33}$ $(CH_2CH_2O)_2OH$ also known as $C_{16}EO_2$ or 2 cetyl ether or combinations thereof and wherein said polyoxyethylene ether surfactant is in combination with at least one other surfactant at least one hydrophilic molecular compound characterized by a molecular weight that is less than that of said polyoxyethylene ether surfactant, and with at least one organic solvent.

48. The method as recited in claim 47, wherein said small surfactants are ammonium-based surfactants.

49. The method as recited in claim 48, wherein said ammonium-based surfactants are cetyl trimethyl ammonium chloride.

50. The method as recited in claim 47, wherein said smaller hydrophilic molecules are selected from the group consisting of glycerol, propylene glycol, and ethylene glycol.

51. The method as recited in claim 47, wherein said organic co-solvents are selected from the group consisting of mesitylene and octane.

52. A method of making a mesoporous film comprising the steps of:
(a) combining a silica precursor with an aqueous solvent, a catalyst and a surfactant into a precursor solution;
(b) spin coating said precursor solution into a templated film;
(c) removing said aqueous solvent, said catalyst and said surfactant from said templated film to form a hydroxylated film characterized by porosity that is disordered as indicated by an absence of a major x-ray diffraction peak in the range of 2 to 6 degrees 2-theta; and
(d) dehydroxylating said hydroxylated film with a gaseous silicon-based organic compound to obtain said mesoporous film.

53. The method of claim 52, wherein the silicon-based organic compound is a silane.

54. The method of claim 52, wherein said silane is selected from the group consisting of trimethyl iodosilane, trimethyl chlorosilane, dimethyl dimethoxy silane, dimethyl dichloro silane, hexaphenyl disilazane, diphenyl tetramethyl silazane and hexamethyl disilazane.

55. A method of making a mesoporous film comprising the steps of:
   (e) combining a silica precursor with an aqueous solvent, a catalyst and a surfactant into a precursor solution;
   (f) spin coating said precursor solution into a templated film;
   (g) removing said aqueous solvent, said catalyst and said surfactant from said templated film and forming a hydroxylated film; and
   (h) dehydroxylating said hydroxylated film with a gaseous silicon-based organic compound and obtaining said mesoporous film, wherein said dehydroxylation of said film occurs in alternating exposures of said film to a vacuum and to the gaseous silane.

56. A method of making a mesoporous film with a surfactant containing solution, the method comprising the steps of:
   (a) combining a silica precursor with an aqueous solvent, a catalyst and a surfactant into a precursor solution;
   (b) dispensing said precursor solution onto said substrate to form a templated film;
   (c) substantially removing said aqueous solvent, said catalyst and said surfactant from said templated film to form a hydroxylated film having porosity; and
   (d) dehydroxylating said hydroxylated film and obtaining said mesoporous film, wherein said porosity is disordered as indicated by an absence of a major x-ray diffraction peak in the range of 2 to 6 degrees 2-theta.

57. The method of claim 56, wherein said dispensing involves spin coating.

58. A method of making a mesoporous film with a surfactant containing solution, the method comprising the steps of:
   (a) combining a silica precursor with an aqueous solvent, a catalyst and a surfactant into a precursor solution;
   (b) dispensing said precursor solution onto a substrate for form a templated film;
   (c) substantially removing said aqueous solvent, said catalyst and said surfactant to form a hydroxylated film having porosity; and
   (d) dehydroxylating said hydroxylated film and obtaining said mesoporous film, said film being characterized by disordered porosity and said film having a thickness of between approximately 0.1 micron and approximately 1.5 microns, said thickness having a standard deviation of less than approximately +/−5%.

59. The method of claim 58, wherein said dispensing involves spin coating.

60. A method of making a mesoporous film with a surfactant containing solution, the method comprising the steps of:
   (a) combining a silica precursor with an aqueous solvent, a catalyst and a surfactant into a precursor solution;
   (b) dispensing said precursor solution onto a substrate to form a templated film;
   (c) heating said templated film, said dispensing and said heating collectively substantially removing said aqueous solvent, said catalyst and said surfactant from said templated firm to form a hydroxylated film having porosity; and
   (d) dehydroxylating said hydroxylated film and obtaining said mesoporous film, said film being characterized by disordered porosity and said film being of substantially uniform thickness having a standard deviation of less than approximately +/−5%.

61. The method of claim 60, wherein said dispensing involves spin coating.

62. A method of making a mesoporous film with a surfactant containing solution, the method comprising the steps of:
   (a) combining a silica precursor with an aqueous solvent, a catalyst and a surfactant into a precursor solution;
   (b) dispensing said precursor solution onto said substrate to form a templated film; and
   (c) substantially removing said aqueous solvent, said catalyst and said surfactant from said templated film to form a mesoporous film having porosity;
   wherein said porosity is disordered as indicated by an absence of a major x-ray diffraction peak in the range of 2 to 6 degrees 2-theta.

* * * * *

UNITED STATES PATENT AND TRADEMARK OFFICE
CERTIFICATE OF CORRECTION

PATENT NO.   : 6,329,017 B1
DATED        : December 11, 2001
INVENTOR(S)  : Liu et al.

It is certified that error appears in the above-identified patent and that said Letters Patent is hereby corrected as shown below:

Title page,
Item [56], References Cited, OTHER PUBLICATIONS, "Oxide Phsphate with a High Surface Area bya Surfactant" should read -- Oxide Phosphate with a High Surface Area by a Surfactant --.

Column 4,
Line 46, "U.S. Pat. No. 5,922,199." should read -- U.S. Pat. No. 5,922,299. --.

Column 6,
Line 26, "FIG. 11 a shows" should read -- FIG. 11a shows --.

Column 7,
Line 2, "1.5 $\mu$m standard" should read -- 1.5 $\mu$m, standard --

Column 7,
Line 13, "U.S. Pat. No.5/922,299," should read -- U.S. Pat. No. 5,922,299,. --

Column 9,
Line 64, " The silanehacuum treatment" should read -- The silane/vacuum treatment --.

Column 18,
Line 11, "10 stearyl ether," should read -- 10 stearyl ether; --
Line 21, "surfactant, catonic surfactant," should read -- surfactant, cationic surfactant --.
Line 55, "in claim 12, " should read -- in claim 1,--.

Column 19,
Lines 28 and 45, "aqueous solvent said" should read -- aqueous solvent, said --.
Line 57, "stearyl etler;" should read -- stearyl ether; --.

Column 20,
Line 54, "precursor wit) an" should read -- precursor with an --.

UNITED STATES PATENT AND TRADEMARK OFFICE
CERTIFICATE OF CORRECTION

PATENT NO. : 6,329,017 B1
DATED : December 11, 2001
INVENTOR(S) : Liu et al.

It is certified that error appears in the above-identified patent and that said Letters Patent is hereby corrected as shown below:

Column 21,
Lines 9 and 30, "solvent said catalyst" should read -- solvent, said catalyst --.
Line 61, "polyoxethylene other surfactant" should read -- polyoxethylene ether surfactant --.
Line 63, "(b) spincoating said" should read -- (b) spin-coating said --.

Column 22,
Line 10, "stearyl ether, $C_{12}H_{25}$" should read -- stearyl ether; $C_{12}H_{25}$ --.
Line 34, "lauryl ether; C16CH33" should read -- lauryl ether; $C_{16}H_{33}$ --.

Column 24,
Line 23, "templated firm to" should read -- templated film to --.

Signed and Sealed this

Third Day of August, 2004

JON W. DUDAS
*Acting Director of the United States Patent and Trademark Office*